(12) United States Patent
Moriwaki

(10) Patent No.: US 8,811,104 B2
(45) Date of Patent: Aug. 19, 2014

(54) SEMICONDUCTOR MEMORY AND SYSTEM

(75) Inventor: Shinichi Moriwaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 64 days.

(21) Appl. No.: 13/529,807

(22) Filed: Jun. 21, 2012

(65) Prior Publication Data
US 2012/0257464 A1 Oct. 11, 2012

Related U.S. Application Data

(63) Continuation of application No. PCT/JP2009/007238, filed on Dec. 25, 2009.

(51) Int. Cl.
G11C 7/02 (2006.01)
(52) U.S. Cl.
USPC .......... 365/210.1; 365/189.11; 365/207; 365/203
(58) Field of Classification Search
CPC .............................. G11C 8/08; G11C 5/145
USPC .............. 365/210.1, 189.11, 210.15, 207, 365/185.17, 185.242
See application file for complete search history.

(56) References Cited

U.S. PATENT DOCUMENTS

| 2002/0186579 | A1 | 12/2002 | Yokozeki |
| 2003/0063493 | A1 | 4/2003 | Yokozeki |
| 2003/0202412 | A1 | 10/2003 | Nii et al. |
| 2003/0231527 | A1* | 12/2003 | Nakase et al. ............... 365/196 |
| 2004/0042275 | A1* | 3/2004 | Yoshizawa et al. ...... 365/189.07 |
| 2004/0141395 | A1 | 7/2004 | Ohtsuki et al. |
| 2009/0213635 | A1* | 8/2009 | Tohata et al. ................. 365/63 |

FOREIGN PATENT DOCUMENTS

| JP | 2002-367377 A | 12/2002 |
| JP | 2003-109379 A | 4/2003 |
| JP | 2003-323792 A | 11/2003 |
| JP | 2004-022070 A | 1/2004 |
| JP | 2004-220721 A | 5/2004 |
| JP | 2008-299907 A | 12/2008 |

* cited by examiner

Primary Examiner — Son Dinh
Assistant Examiner — Uyen B Tran
(74) Attorney, Agent, or Firm — Arent Fox LLP

(57) ABSTRACT

A semiconductor memory includes a real memory cell; a sense amplifier configured to amplify data read from the real memory cell in response to activation of a sense amplifier enable signal; a replica circuit including a plurality of replica units connected in series, each of replica units including a plurality of dummy memory cells connected in parallel, wherein one of dummy memory cells of one of replica units is accessed in response to data which is read from one of dummy memory cells of one of replica units of a prior stage; and an operation control circuit configured to activate a dummy access signal to access one of dummy memory cells of one of replica units of a first stage in response to a read command, and to activate the sense amplifier enable signal in response to data read from one of replica units of a last stage.

7 Claims, 20 Drawing Sheets

FIG.15

| NUMBER OF USED STAGES | CT1 | CT2 | CT3 | CT4 | TIMING OF ACTIVATING SAE |
|---|---|---|---|---|---|
| 1 STAGE | 1 | 0 | 0 | 0 | FAST ↑ |
| 2 STAGES | 0 | 1 | 0 | 0 | |
| 3 STAGES | 0 | 0 | 1 | 0 | ↓ |
| 4 STAGES | 0 | 0 | 0 | 1 | SLOW |

SEMICONDUCTOR MEMORY AND SYSTEM

CROSS-REFERENCE TO RELATED APPLICATION

This patent application is based upon and claims the benefit of priority under 35 DSC 120 and 365(c) of PCT application JP2009/007238 filed in Japan on Dec. 25, 2009, the entire contents of which are incorporated herein by reference.

FIELD

The present invention is related to a semiconductor memory including a sense amplifier, and a system in which the semiconductor memory is installed.

BACKGROUND

In a semiconductor memory such as SRAM, there is a proposed method of setting the timing of activating a sense amplifier in accordance with data being read into a dummy bit line from a dummy memory (see, for example, patent document 1). By connecting plural dummy memory cells to dummy bit lines, the timing of activating the sense amplifier is accelerated, and the inconsistencies in transistor characteristics are averaged out (see, for example, patent document 2). By changing the number of dummy memory cells connected to the dummy bit lines, the timing of activating a sense amplifier is adjusted (see, for example, patent document 3).
Patent Document 1: Japanese Laid-Open Patent Publication No. 2004-22070
Patent Document 2: Japanese Laid-Open Patent Publication No. 2003-323792
Patent Document 3: Japanese Laid-Open Patent Publication No. 2004-220721

The timing of activating a sense amplifier becomes faster as the number of dummy memory cells connected to dummy bit lines increases. Therefore, to optimize the timing of activating a sense amplifier, it is not possible to significantly increase the number of dummy memory cells. That is to say, in the conventional technology, it is not possible to significantly increase the number of dummy memory cells, and therefore the effect of averaging out the inconsistencies in transistor characteristics is limited.

SUMMARY

According to an embodiment of the present invention, a semiconductor memory includes a real memory cell; a sense amplifier configured to amplify data read from the real memory cell in response to activation of a sense amplifier enable signal; a replica circuit including a plurality of replica units connected in series, each of the plurality of replica units including a plurality of dummy memory cells connected in parallel, wherein one of the plurality of dummy memory cells of one of the plurality of replica units is accessed in response to data which is read from one of the plurality of dummy memory cells of one of the plurality of replica units of a prior stage; and an operation control circuit configured to activate a dummy access signal to access one of the plurality of dummy memory cells of one of the plurality of replica units of a first stage in response to a read command, and to activate the sense amplifier enable signal in response to data read from one of the plurality of replica units of a last stage.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF DRAWINGS

FIG. 15 illustrates an example of operation specifications of the replica circuit indicated in FIG. 14.

DESCRIPTION OF EMBODIMENTS

Figure 1:
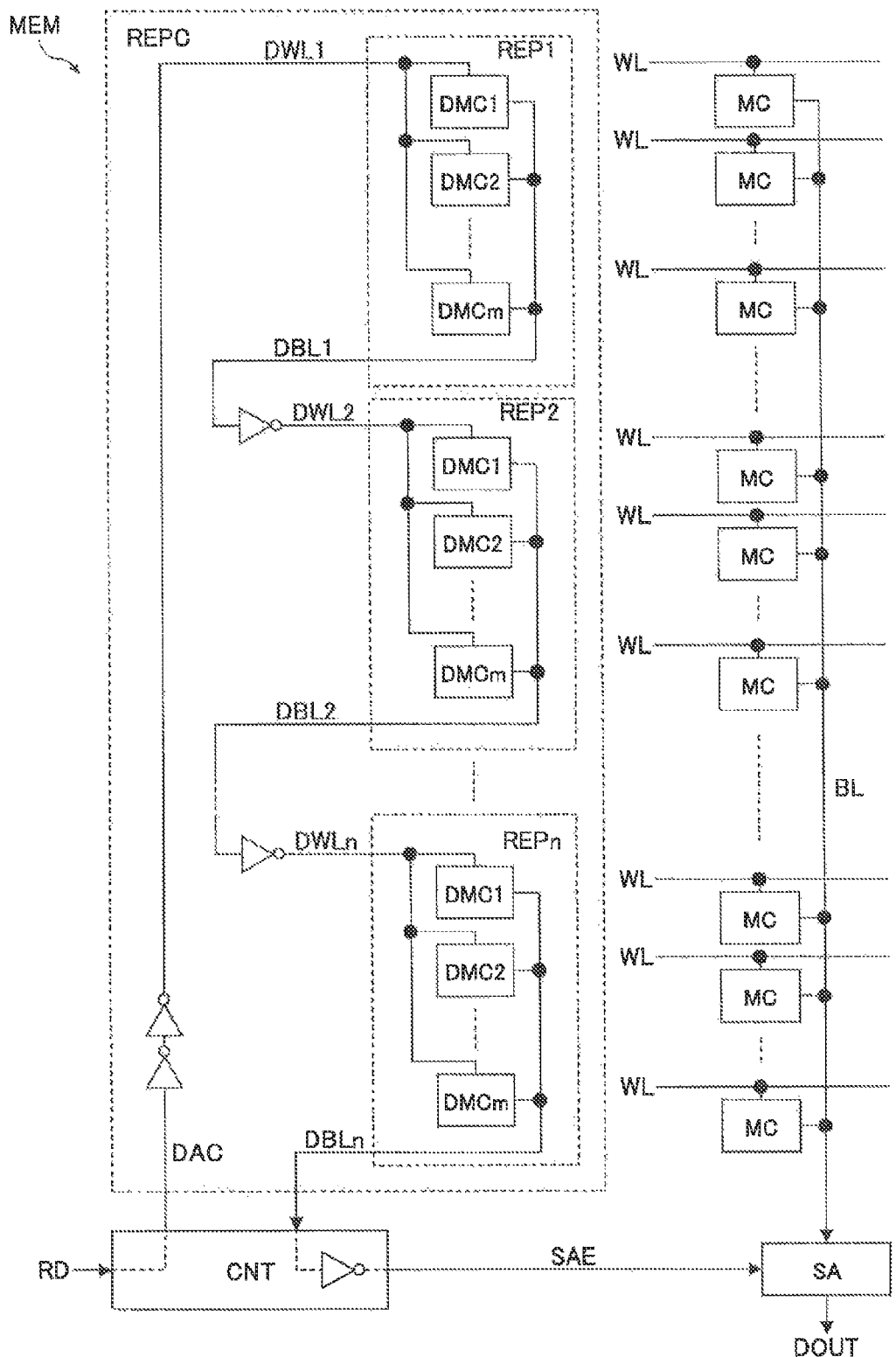
FIG. 1 indicates an example of a semiconductor memory according to one embodiment.

Embodiments are described with reference to drawings. In the drawings, a signal line indicated by a thick line means that plural signal lines are included. Part of a block to which a thick line is connected includes plural circuits. Signal lines to which signals are transmitted are denoted by the same reference numerals as the signal names. A signal denoted by a reference numeral ending with "X" indicates a negative logic. A double square mark in the drawings indicates an external terminal. An external terminal is, for example, a pad on a semiconductor chip, or a lead of a package in which a semiconductor chip is stored. A signal that is supplied via an external terminal is denoted by the same reference numeral as that of the terminal.

FIG. 1 indicates an example of a semiconductor memory MEM according to one embodiment. For example, a semiconductor memory MEM is a static RAM. The semiconductor memory MEM may operate in a synchronous manner with clock signals, or may operate in an asynchronous manner with clock signals. The semiconductor memory MEM may be designed as a semiconductor memory device enclosed in a package, or as a memory macro (IP) installed in a system LSI.

The semiconductor memory MEM includes plural real memory cells MC, a sense amplifier SA, a replica circuit REPC including plural replica units REP (REP1 through REPn), and an operation control circuit CNT. The real memory cells MC are connected to respective real word lines WL, and are also connected to a common real bit line BL. The number of memory cells MC may be one. In the following description, the real memory cell MC may also be referred to a memory cell MC, a real word line WL may also be referred to as a word line WL, and a real bit line BL may also be referred to as a bit line BL.

In response to any one of the word lines WL being activated, a memory cell MC is selected and read/accessed, and the data held in the memory cell MC is output to the bit line BL. For example, a word line WL is selected in response to an address signal supplied together with a read command RD. The sense amplifier SA amplifies the signal amount of the data read into the bit line BL, in response to sense amplifier enable signals SAE activated in response to the read command RD. The sense amplifier SA outputs the amplified data as read data DOUT.

The replica units REP (REP1 through REPn) are the same circuits, although not particularly limited thereto. Therefore, a description is given of the replica unit REP1 in the first stage. The replica unit REP1 includes m number of dummy memory cells DMC (DMC 1 through DMCm) connected in parallel between a dummy wordline DWL1 and the dummy bit line DBL1. The dummy memory cells DMC 1 through DMCm hold data of the same logic.

Figure 7:
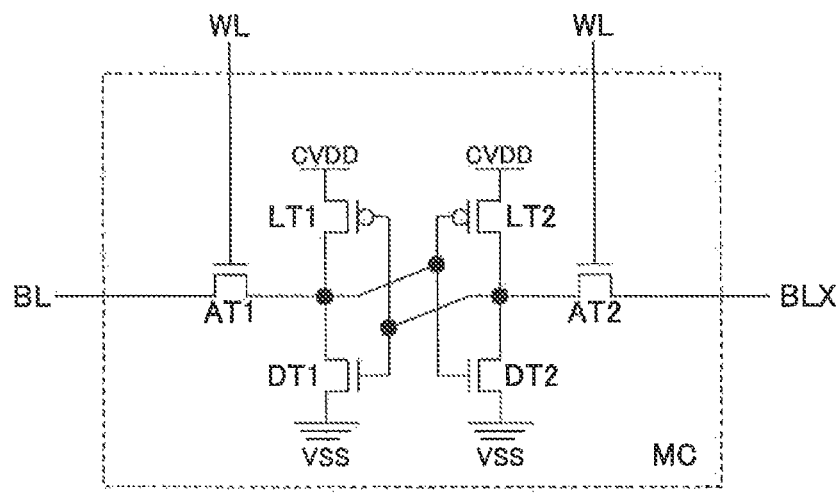
FIG. 7 illustrates an example of a memory cell indicated in FIG. 3.
Figure 8:
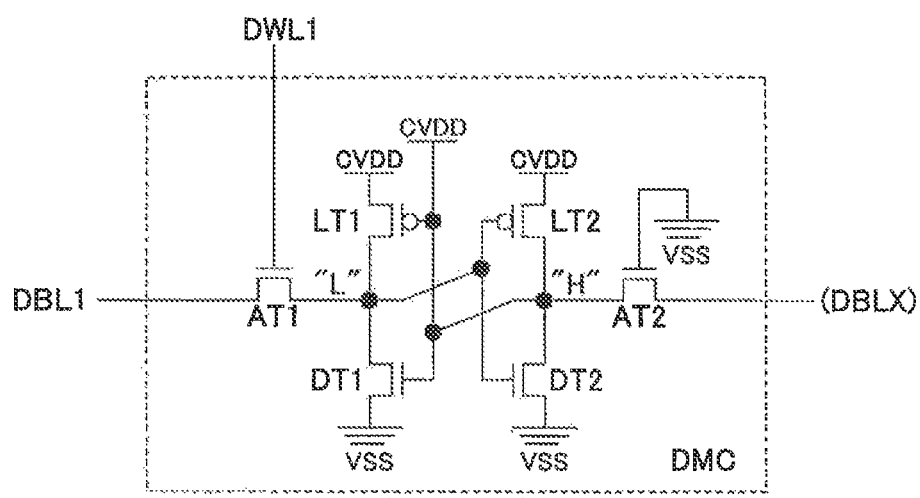
FIG. 8 illustrates an example of a dummy memory cell indicated in FIG. 4.

The element configuration of the dummy memory cell DMC is the same as that of the real memory cell MC. That is to say, a pMOS transistor and an nMOS transistor forming the dummy memory cell DMC have the same structure and electric properties as the pMOS transistor and nMOS transistor forming the real memory cell MC. Circuit examples of the real memory cell MC and dummy memory cell DMC are illustrated in FIG. 7 and FIG. 8, respectively.

For example, the total number (m×n) of dummy memory cells DMC of the replica units REP1 through REPn is smaller than the number of memory cells MC connected to the bit line BL. Thus, the dummy memory cells DMC may be aligned in one line along the direction of the bit line BL, similar to the memory cells MC. This is also applicable to the following embodiments. The dummy memory cells DMC that are not used in the replica units REP1 through REPn are arranged as shape dummies. Accordingly, the intervals between the dummy memory cells DMC and the intervals between the memory cells MC may be the same, and the electric properties of the dummy memory cells DMC and the memory cells MC may also be the same. When the total number of dummy memory cells DMC is larger than the number of memory cells MC connected to the bit line BL, the dummy memory cells DMC are aligned in plural lines along the direction of the bit line BL.

The replica unit REP1 of the first stage outputs, to the dummy bit line DBL1, the data that is read from the dummy memory cells DMC1 through DMCm, in response to the dummy word line DWL1 being activated in response to a dummy access signal DAC. The replica units REP2 through REPn from the second stage onward activate the corresponding dummy word line signals DWL (DWL2 through DWLn) in response to data read into the dummy bit line DBL (DBL1 through DBLn-1) of the replica unit REP of the previous stage, and accesses and reads data from the dummy memory cells DMC. The replica units REP2 through REPn sequentially output, to the dummy bit lines DBL (DBL2 through DBLn), the data read from the dummy memory cells DMC1 through DMCm.

The operation control circuit CNT activates dummy access signals DAC for accessing and reading data from the dummy memory cells DMC of the replica unit REP1 of the first stage, in response to a read command RD. Furthermore, the operation control circuit CNT activates the sense amplifier enable signals SAE in response to data read into the dummy bit line DBLn of the replica unit REPn of the last stage.

In the present embodiment, in the respective replica units REP, data is read into the common dummy bit line DBL (DBL1 through DBLn) from the m number of dummy memory cells DMC accessed simultaneously. The length (load capacity) of each dummy bit line DBL is approximately 1/n of the real bit line BL. Thus, the speed of voltage changes of the dummy bit line DBL is approximately m time the speed at which the voltage of the bit line BL decreases by the data read from one memory cell MC. That is to say, the voltage amount of the dummy bit lines DBL (DBL1 through DBLn) that decreases in response to the dummy word line signals DWL (DWL1 through DWLn) being activated, is approximately m times the voltage amount of the bit line BL that decreases in response to the word line WL being activated.

Meanwhile, the n number of replica units REP1 through REPn are connected in series. Accordingly, the speed of voltage decrease of the last dummy bit line DBLn responding to the activation of the dummy access signal DAC may be regarded as m/n times the speed of voltage decrease of the bit line BL responding to the activation of the word line WL. Therefore, by increasing the number of replica units REP connected in series, the number of dummy memory cells DMC used for generating sense amplifier enable signals SAE are increased.

Generally, the transistor characteristics such as a threshold voltage indicate a normal distribution. Therefore, the greater the number of dummy memory cells DMC used for generating sense amplifier enable signals SAE, the more the inconsistencies in transistor characteristics of dummy memory cells DMC are averaged out. Accordingly, the inconsistencies in the timings of activating the sense amplifier enable signals SAE are reduced. Thus, by increasing the dummy memory cells DMC used for generating sense amplifier enable signals SAE, the timings of activating the sense amplifiers SA are prevented from changing according to transistor characteristics. Furthermore, in the conventional technology, as the number of dummy memory cells DMC are increased, the speed of the voltage decrease of the dummy bit line DBL1 increases, and the timing of activating the sense amplifier enable signals SAE is accelerated. Therefore, it has not been possible to significantly increase the number of dummy memory cells DMC. However, in the present embodiment, the number of dummy memory cells DMC is unlimited.

As described above, in the present embodiment, it is possible to increase the number of dummy memory cells DMC used for generating the timings of activating the sense amplifier SA. Accordingly, the inconsistencies in transistor characteristics of the dummy memory cells DMC are sufficiently averaged out, and the timing of activating the sense amplifier SA is optimized. For example, even if the threshold voltage of the transistor shifts due to variations in manufacturing conditions, the timing of activating the sense amplifier enable signals SAE is prevented from moving significantly. As a result, the reading margin of the semiconductor memory MEM is improved, and the yield of the semiconductor memory MEM, an indicator of good quality, is increased.

Figure 2:
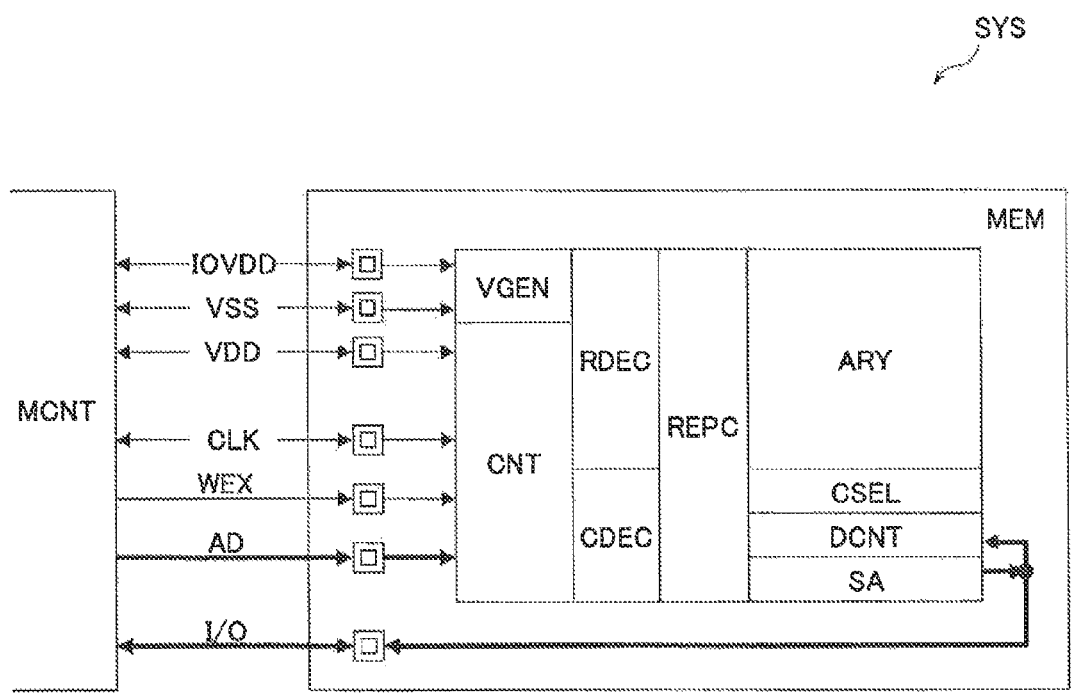
FIG. 2 indicates an example of a semiconductor memory according to another embodiment.

FIG. 2 indicates an example of a semiconductor memory MEM according to another embodiment. Elements corresponding to those described in the above embodiment are denoted by the same reference numerals, and are not further described in detail. For example, the semiconductor memory MEM is a static RAM. The semiconductor memory MEM operates in a synchronous manner with clock signals CLK, but may operate in an asynchronous manner with clock signals CLK.

For example, the semiconductor memory MEM is installed in the system SYS together with a memory controller MCNT. In order to control access to the semiconductor memory MEM, the memory controller MCNT outputs, to the semiconductor memory MEM, write enable signals WEX, address signals AD, and write data signals I/O, and receives read data signals I/O from the semiconductor memory MEM. The semiconductor memory MEM and the memory controller MCNT may be designed as semiconductor devices enclosed in packages, or as memory macros (IP) installed in a system LSI.

For example, the semiconductor memory MEM is formed on a silicon substrate by a CMOS process. The semiconductor memory MEM includes an internal voltage generating circuit VGEN, an operation control circuit CNT, a row decoder RDEC, a column decoder CDEC, a replica circuit REPC, a memory cell array ARY, a column selection circuit CSEL, a data control circuit DCNT, and a sense amplifier SA. An example of the memory cell array ARY is illustrated in FIG. 3.

Figure 3:
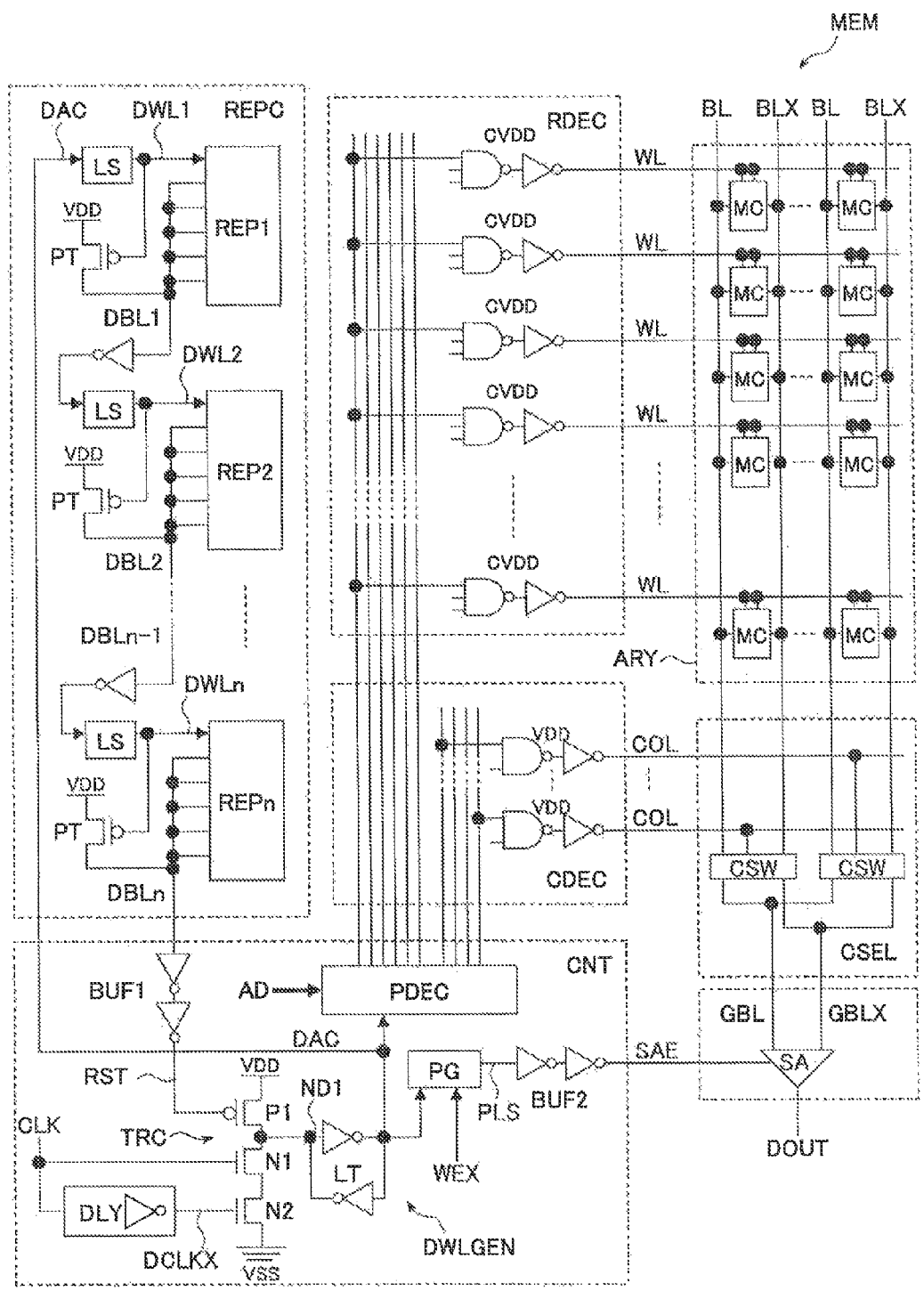
FIG. 3 illustrates an example of a circuit in the semiconductor memory indicated in FIG. 2.

The internal voltage generating circuit VGEN uses an external power source voltage IOVDD to generate, for example, a high level, voltage CVDD of a word line WL (FIG. 3). The high level voltage CVDD may also be used as a high level voltage of the power source of the memory cell MC (FIG. 3) and the dummy word lines DWL1 through DWLn (FIG. 3). The high level voltage CVDD is lower than the external power source voltage IOVDD and higher than the external power source voltage VDD. The external power source voltage IOVDD is supplied to the power source terminal of the data input buffer connected to the data terminal I/O and the power source terminal of the data output buffer. The external power source voltage VDD is supplied to power source terminals of circuits other than the circuits to which the external power source voltage IOVDD and the high level voltage CVDD are supplied.

The operation control circuit CNT receives, for example, write enable signals WEX and address signals AD in a synchronous manner with clock signals CLK. When the write enable signals WEX are high level, the operation control circuit CNT detects a read command, and executes a read access operation on the memory cell MC indicated by the address signals AD. When the write enable signals WEX are low level, the operation control circuit CNT detects a write command, and executes a write access operation on the memory cell MC indicated by the address signals AD. The operation control circuit CNT includes a predecoder (FIG. 3) of the address signals AD. An example of the operation control circuit CNT is illustrated in FIG. 3.

Figure 4:
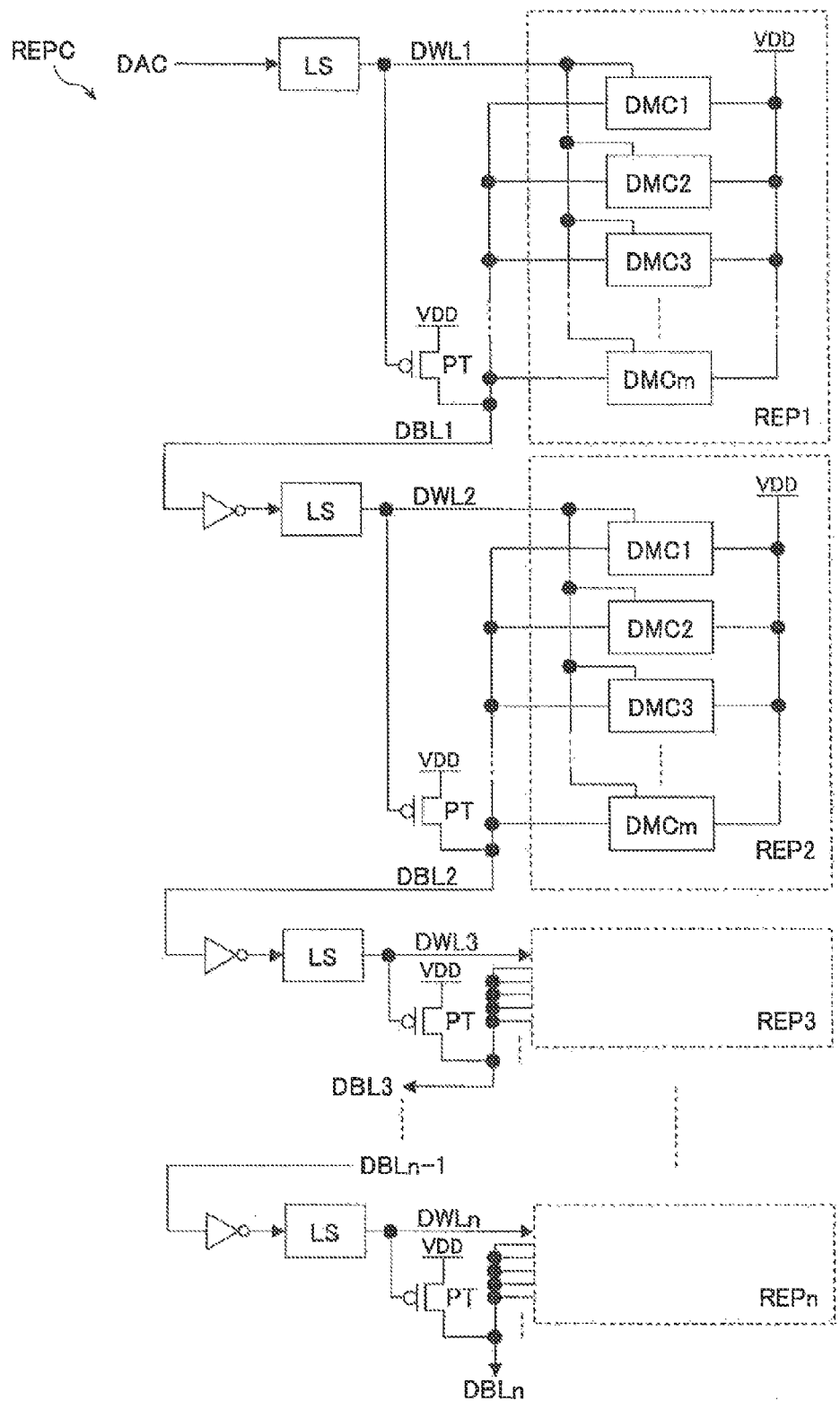
FIG. 4 illustrates an example of a replica unit indicated in FIG. 3.

At the time of the read access operation and the write access operation, the row decoder RDEC activates any one of the word lines in response to a row predecode signal supplied from the operation control circuit CNT. At the time of the read access operation and the write access operation, the column decoder CDEC activates any one of the column selection signal lines COL (FIG. 3) in response, to column predecoder signals supplied from the operation control circuit CNT. The replica circuit REPC includes plural dummy memory cells DMC1 through DMCm (FIG. 4) and plural dummy bit lines DBL1 through DBLn (FIG. 4) for generating timings for activating the sense amplifier SA. Examples of the row decoder RDEC, the column decoder CDEC, and the replica circuit REPC are illustrated in FIG. 3 and FIG. 4.

Figure 10:
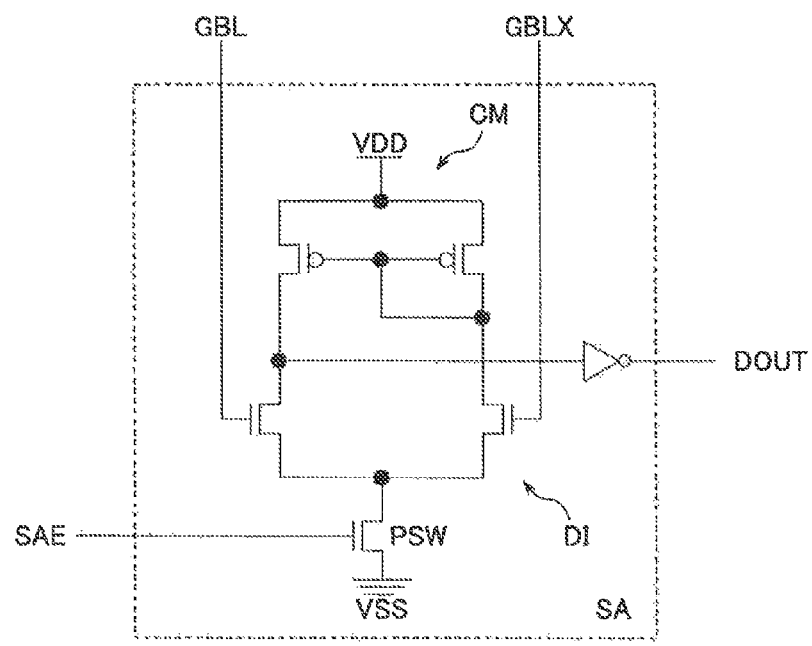
FIG. 10 illustrates an example of a sense amplifier indicated in FIG. 3.

The column selection circuit CSEL connects a pair of bit lines BL, BLX (FIG. 3) corresponding to the activated column selection signal lines COL, to the data control circuit DCNT or the sense amplifier SA. The data control circuit DCNT operates at the time of the write access operation, and supplies the write data received at the data terminal I/O to the column selection circuit CSEL. An example of the column selection circuit CSEL is illustrated in FIG. 8. At the time of the read access operation, the sense amplifier SA amplifies the signal amount of read data supplied from the column selection circuit CSEL, and outputs the amplified read data to the data terminal I/O. An example of the sense amplifier SA is illustrated in FIG. 10.

FIG. 3 illustrates an example of a circuit of the semiconductor memory MEM illustrated in FIG. 2. In FIG. 3, the replica circuit REPC is disposed on the left side of the row decoder RDEC. However, in the actual circuit, the replica circuit REPC is disposed between the row decoder RDEC and the memory cell array ARY.

The replica circuit REPC includes plural replica units REP (REP1, REP2, ..., REPn), and level shifters LS and precharge transistors PT corresponding to the respective replica units REP. The replica units REP include plural dummy memory cells DMC1 through DMCm (FIG. 4) connected in parallel to corresponding plural dummy hit lines DBL (DBL1, DBL2, ..., DBLn). An example of a replica unit REP is illustrated in FIG. 4.

Each level shifter LS converts an input signal of a high level voltage VDD into a high level voltage CVDD, and outputs the high level voltage CVDD. The level shifter LS corresponding to the replica unit REP1 of the first stage converts the high level voltage VDD of the dummy access signal DAC into a high level voltage CVDD, and outputs the high level voltage CVDD to the dummy word line DWL1.

Figure 6:
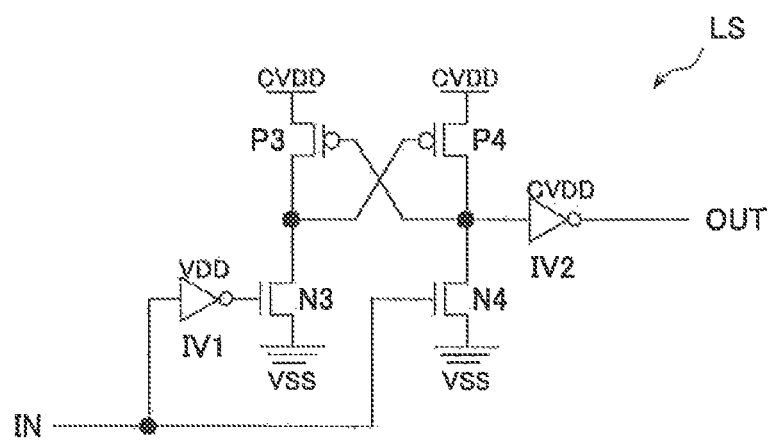
FIG. 6 illustrates an example of a level shifter indicated in FIG. 4.

The level shifters LS corresponding to the replica units REP2 through REPn of the second stage and onward receive signals created by inverting dummy bit line signals DBL (DBL1, DBL2, ..., DBLn-1) from previous stages with a CMOS inverter, and outputs the signals as dummy word line signals DWL (DWL2, DWL3, ..., DWLn). The level shifters corresponding to the replica units REP2 through REPn from the second stage onward also convert input signals of a high level voltage VDD into a high level voltage CVDD and output the high level voltage CVDD. An example of a level shifter LS is illustrated in FIG. 6.

The precharge transistors PT are formed by, for example, pMOS transistors. The precharge transistor PT is turned on when the corresponding dummy word line DWL is at a low level, and sets the corresponding dummy bit line DBL to a high level voltage VDD.

In the present embodiment, the level changes in the dummy access signal DAC from the operation control circuit CNT are sequentially transmitted to the replica units REP1, REP2, ..., REPn. The operation control circuit CNT activates sense amplifier enable signals SAE in response to a level change in the last dummy bit line DBLn.

The operation control circuit CNT includes a dummy word line signal generating unit DWLGEN, a predecoder PDEC, a pulse generator PG, and buffer circuits BUF1 and BUF2. The dummy word line signal generating unit DWLGEN includes a transistor row TRC, a delay circuit DLY, and a latch circuit LT. The operation control circuit CNT activates dummy access signals DAC to a high level in a synchronous manner with a rising edge of clock signals CLK. Furthermore, when a low level of a dummy bit line DBLn is detected as a reset signal RST, the operation control circuit CNT inactivates the dummy access signal DAC to a low level. Furthermore, at the time of a read access operation, the operation control circuit CNT activates the sense amplifier enable signal SAE to a high level for a predetermined period, in a synchronous manner with the dummy access signals DAC being inactivated.

The transistor row TRC includes a pMOS transistor P1 and nMOS transistors N1, N2 which are disposed in series between a power source line VDD and a ground line VSS. The delay circuit DLY delays the clock signals CLK by a predetermined time, and outputs the logic-inverted signals as delay clock signals DCLKX to the gate of the nMOS transistor N2. The gate of the nMOS transistor N1 receives clock signals CLk. The gate of the pMOS transistor P1 receives reset signals RST. The reset signals RST are set to the same logic level, as the dummy bit line DBLn via the buffer circuit BUF1.

The latch circuit LT is connected to the connection node ND1 of the transistors P1, N1, and outputs logic-inverted signals of the connection node ND1 as dummy access signals DAC, to the predecoder PDEC, the pulse generator PG, and the replica circuit REPC. The predecoder PDEC operates while the dummy access signals DAC are at high level, and generates row predecode signals and column predecode signals in response to address signals AD. Although not particularly limited, the row predecode signals are generated with the use of bits of upper levels of the address signals AD, and the column predecode signals are generated with the use of bits of lower levels of the address signals AD.

The pulse generator PG operates when the write enable signals WEX are at high level, and generates pulse signals PLS in a synchronous manner with the failing edge of the dummy access signals DAC. The write enable signals WEX of a high level indicate a read access cycle. The buffer circuit BUF2 outputs the pulse signals PLS as sense amplifier enable signals SAE.

The row decoder RDEC sets any one of the word lines WL as the high level voltage CVDD in response to low predecode signals from the predecoder PDEC. Accordingly, the power source terminal of the driver circuit (AND circuit in this example) driving the word lines WL in the row decoder RDEC is connected to a high level voltage line CVDD. The column decoder CDEC sets the column selection signal lines COL to a high level voltage VDD in response to column predecode signals from the predecoder PDEC. Accordingly, the power source terminal of the driver circuit (AND circuit in this example) driving the column selection signal lines COL in the column decoder CDEC is connected to the power source voltage lines VDD.

The memory cell array ARY includes plural static memory cells MC arranged in a matrix. The rows of the memory cells MC arranged horizontally in FIG. 3 are connected to word lines WL. The rows of the memory cells MC arranged vertically in FIG. 3 are connected to complementary hit lines BL, BLX.

Figure 9:
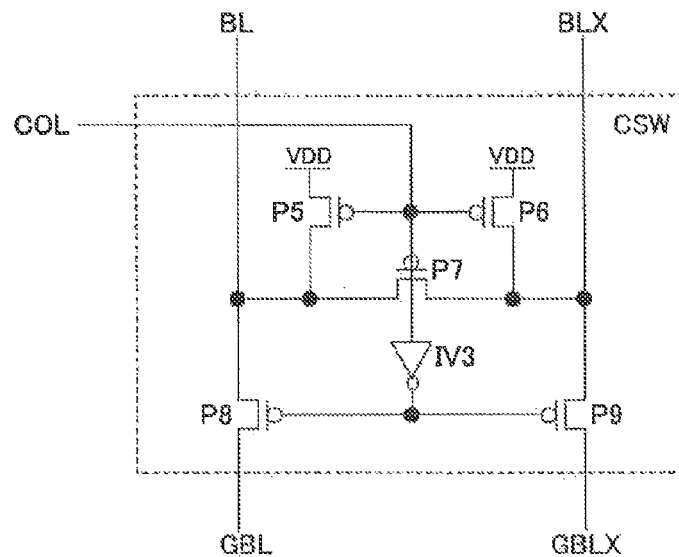
FIG. 9 illustrates an example of a column switch indicated in FIG. 3.

The column selection circuit CSEL includes column switches CSW for selectively connecting the bit lines BL, BLX to global hit lines GBL, GBLX. An example of the column switch CSW is illustrated in FIG. 9. The sense amplifier SA operates while the sense amplifier enable signals SAE are at high level, amplifies the difference in the signal amount between the global bit lines GBL, GBLX, and outputs the amplified signals as read data DOUT. The memory cell array ARY, the column selection circuit CSEL, and the sense amplifier SA illustrated in FIG. 3 indicate a circuit corresponding to one data terminal I/O. The circuit corresponding to the other data terminal I/O is the same as that illustrated in FIG. 3.

FIG. 4 illustrates an example of the replica units REP (REP1, REP2, REP3, ..., REPn) illustrated, in FIG. 3. The replica units REP are the same circuits, and therefore a description is given of the replica unit REP1.

The replica unit REP1 includes m number of dummy memory cells DMC (DMC1, DMC2, ..., DMCm). An example of a circuit of the dummy memory cell DMC is illustrated in FIG. 8. The dummy word line DWL1 and the dummy bit line DBL1 are commonly connected to m number of dummy memory cells DMC.

The dummy memory cell DMC stores a logic 0, and when the dummy word line DWL1 is activated to a high level, the dummy memory cell DMC outputs low level to the dummy bit line DBL1. At this time, the electric current flowing to the dummy bit line DBL1 is m times the electric current flowing to the real bit line BL connected to the real memory cell MC. Therefore, the speed of voltage decrease of the dummy bit line DBL1 is approximately m times the speed of voltage decrease of the real bit line BL. That is to say, the amount of voltage decrease of the dummy bit line DBL1 in response to activating the dummy word line DWL1 is approximately m times the amount of voltage decrease of the real bit line BL in response to the real word line WL being activated.

When the dummy word line DWL1 is activated to high level in response to the dummy access signal DAC being activated to high level, the precharge transistor PT stops precharging the dummy bit line DBL1. The voltage of the dummy bit line DBL1 decreases according to the low level output from the dummy memory cells DMC of the replica unit REP1. When the voltage of the dummy bit line DBL1 exceeds the logic threshold of the CMOS inverter, a high level (VDD) is transmitted to the input of the level shifter LS of the next stage, and the dummy word line DWL2 is activated to a high level (CVDD). As the dummy word line DWL2 is activated, the precharging of the dummy word line DWL2 stops, and the voltage of the dummy word line DWL2 decreases according to a low level output from the dummy memory cells of the replica unit REP2. As described above, in response to the dummy access signals DAC being activated, the dummy word lines DWL1 through DWLn are sequentially activated to high level, and the voltages of the dummy bit lines DBL1 through DBLn sequentially decrease.

As described above, the voltage decrease amount of the dummy bit lines DBL1 through DBLn of the replica units REP1 through REPn is approximately m times the voltage decrease amount of a bit line BL. Meanwhile, the replica units REP1 through REPn are connected in series, and the voltage decrease time of the dummy bit lines DBL1 through DBLn is accumulated. Thus, the voltage decrease amount of the dummy bit line DBLn in response to the tummy word line DWL being activated is assumed to be m/n times the voltage, decrease amount of the real bit line BL in response to the real, word line WL being activated.

For example, it is assumed that the external power source voltage VDD is 1.1 V, and the set value of the voltage difference between the pair of bit lines BL, BLX is 110 mV (i.e., 0.11 V) when the sense amplifier SA starts operating in the read access operation. In FIG. 3, it is assumed that the logic threshold of the CMOS inverter connected to the last dummy bit line DBLn (for example, n=4) is half (0.55 V) that of the external power source voltage VDD. At this time, to generate sense amplifier enable signals SAE of optimum timings in response to the dummy bit line DBLn changing to low level, the voltage decrease amount of the dummy bit line DBLn is to be set at five times (0.55/0.11) the voltage decrease amount of the bit line BL (or BLX).

In the present embodiment, for example, four replica units REP1 through REP4 (n=4) each including 20 (m=20) dummy memory cells DMC are formed in the replica circuit REPC (m/n=5), so that sense amplifier enable signals SAE of optimum timings are generated. Alternatively, 16 replica units REP1 through REP16 (n=16) each including 80 (m=80) dummy memory cells DMC may be formed in the replica circuit REPC (m/n=5), so that sense amplifier enable signals SAE of optimum timings are generated.

In the present embodiment, it is possible to arbitrarily increase the number of dummy memory cells DMC to be used for generating the sense amplifier enable signals SAE of optimum timings. The greater the number dummy memory cells DMC used for generating the sense amplifier enable signals SAE, the more the transistor characteristics in the dummy access signals DAC are averaged out. Accordingly, the inconsistencies in the timings of generating the sense amplifier enable signals SAE are reduced.

Meanwhile, when forming the replica circuit REPC by one replica unit REP1 illustrated in FIG. 4, in order to set the voltage decrease amount of the dummy bit line DBL1 to be five times that of the bit line BL (or BLX), only five dummy memory cells DMC may be used. In this case, the inconsistencies in transistor characteristics are not sufficiently averaged out, and therefore inconsistencies in the timings of generating sense amplifier enable signals SAE are not sufficiently reduced.

Figure 5:
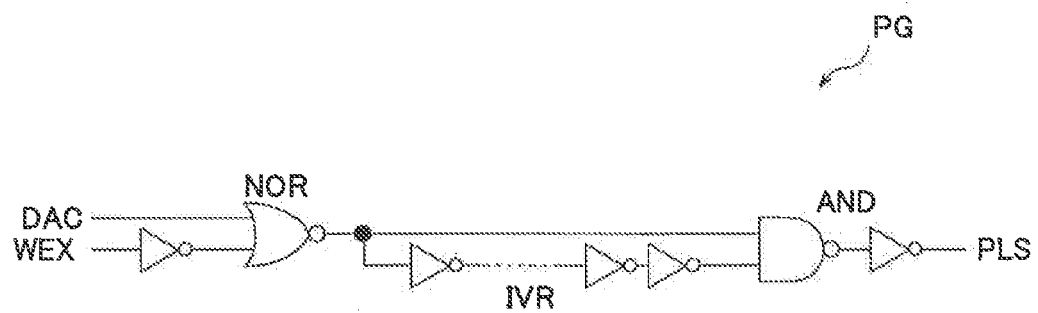
FIG. 5 illustrates an example of a pulse generator indicated in FIG. 3.

FIG. 5 illustrates an example of the pulse generator PG indicated in FIG. 3. The pulse generator PG includes a NOR gate, inverter rows IVR of an odd number of stages, and an AND circuit. The NOR gate outputs a high level, when a dummy access signal DAC of a low level and a signal obtained by inverting a write enable signal WEX of a high level are received. The AND circuit outputs pulse signals PLS having a positive pulse width corresponding to the delay time of the inverter row IVR in a synchronous manner with a falling edge of dummy access signals DAC. The pulse signals PLS are output as the sense amplifier enable signals SAE via the buffer circuit BUF2 illustrated in FIG. 3.

FIG. 6 illustrates an example of a level shifter LS indicated in FIG. 4. The level shifter LS includes pMOS transistors P3, P4, nMOS transistors N3, N4, and CMOS inverters IV1, IV2. The power source terminal of the CMOS inverter IV1 is connected to the external power source voltage line VDD. The power source terminal of the CMOS inverter IV2 is connected to the high level voltage line CVDD.

The transistors P3, N3 are connected in series between the high level, voltage line CVDD and the ground line VSS. The gate of the transistor N3 is connected to an input terminal IN via a CMOS inverter IV1. The drain of the transistor N3 is connected to the gate of the transistor P4. The gate of the transistor N4 is connected to the input terminal IN. The drain of the transistor N4 is connected to the gate of the transistor P3 and the input of the CMOS inverter IV2. The output of the CMOS inverter IV2 is connected to the output terminal OUT.

When a high level voltage VDD is received at the input terminal IN, the level shifter LS outputs a high level voltage CVDD from the output terminal OUT. When a low level voltage VSS is received at the input terminal IN, the level shifter LS outputs a low level voltage VSS from the output terminal OUT.

FIG. 7 illustrates an example of the memory cell MC indicated in FIG. 3. The memory cell MC includes load transistors LT1, LT2 (pMOS transistor), driver transistors DT1, DT2 (nMOS transistor), and access transistors AT1, AT2 (nMOS transistor), similar to a typical static RAM. The load transistors LT1, LT2 have the same structure and electric properties. The driver transistors DT1, DT2 have the same structure and electric properties. The access transistors AT1, AT2 have the same structure and electric properties.

FIG. 8 illustrates an example of the dummy memory cell DMC indicated in FIG. 4. FIG. 8 illustrates the dummy memory cell DMC of the replica unit REP1 indicated in FIG. 4. The dummy memory cells DMC of the other replica units REP2 through REPn are the same as that in FIG. 8, except that the connected signal lines have different names.

The element configuration of the dummy memory cell DMC is the same as the element configuration of the memory cell MC illustrated in FIG. 7. However, in the dummy memory cell DMC, the gates of the load transistor LT1 and the driver transistor DT1 are connected to the high level voltage line CVDD, and the gate of the access transistor AT2 is connected to the ground line VSS. Accordingly, the dummy memory cell constantly maintains a low level L. That is to say, when the dummy word line DWL1 is activated to a high level, the dummy memory cell DMC constantly outputs a low level L to the dummy hit line DBL1.

FIG. 9 illustrates an example of a column switch CSW indicated in FIG. 3. The column switch CSW includes pMOS transistors P5 through P9 and a CMOS inverter IV3. The pMOS transistors P5 through P9 operate as precharge circuits (equalize circuits) of hit lines BL, BLX. That is to say, when the column selection signal lines COL are low level, the bit lines BL, BLX are precharged by the power source voltage VDD via the pMOS transistors P5, P6, and are equalized via the pMOS transistor P7. The pMOS transistors P8, P9 are turned on while the column selection signal lines COL are high level, and connect the bit lines BL, BLX to the global bit lines GBL, GBLX.

FIG. 10 illustrates an example of a sense amplifier SA indicated in FIG. 3. The sense amplifier SA is a so-called current mirror type, and includes a current mirror unit CM including a pair of pMOS transistors, and a differential input unit DI including a pair of nMOS transistors. The differential input unit DI connects the gates of the nMOS transistors to the global bit lines GBL, GBLX, and connects the sources of the nMOS transistors to the ground line VSS via a power source switch circuit PSW. The power source switch circuit PSW is formed by a nMOS transistor, and is turned on in response to receiving the sense amplifier enable signals SAE of a high level at the gate.

The drain of the nMOS transistor, which receives the global bit line GBL at the gate, is connected to a data output signal line DOUT via the CMOS inverter. The sense amplifier SA is activated while the sense amplifier enable signals SAE are at high level, and performs differential amplification on the voltage difference between the global bit lines GBL, GBLX. The sense amplifier SA outputs the data output signals POUT having the same logic as the logic of the data on the global bit line GBL. The data output signals DOUT are latched to the data output latch, and are output from the data terminal I/O.

Figure 11:
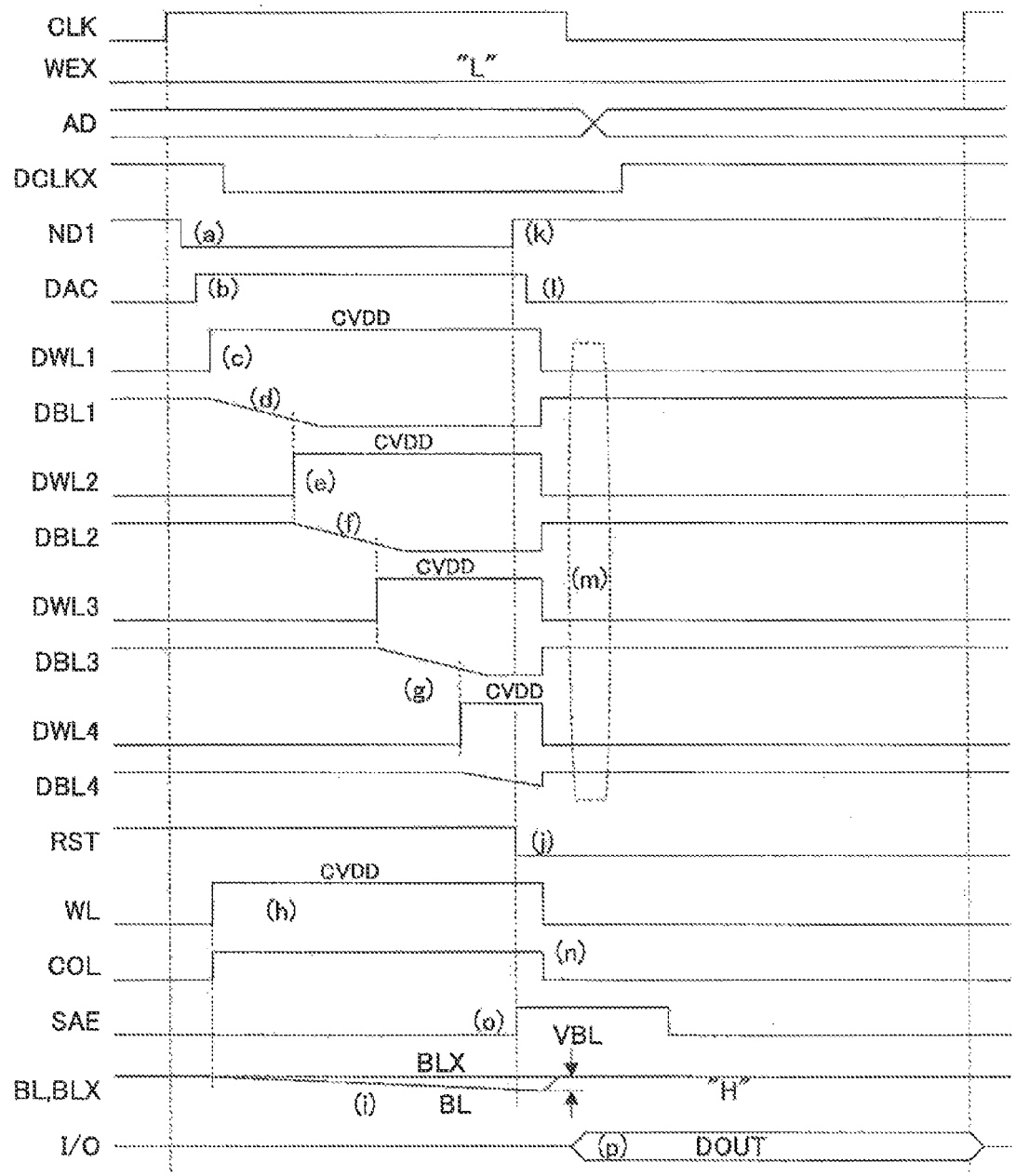
FIG. 11 illustrates an example of a read access operation of the semiconductor memory indicated in FIG. 2.

FIG. 11 illustrates an example of a read access operation of the semiconductor memory MEM indicated in FIG. 2. The semiconductor memory MEM according to the present embodiment executes the read access operation by a clock cycle in which the write enable signals WEX are a high level. The read access operation period is one clock cycle. As a matter of simplification, it is assumed that the replica circuit REPC includes four replica units REP1 through REP4, and that each of the replica units REP1 through REP4 includes 20 dummy memory cells DMC. For example, the address signals AD are supplied to the semiconductor memory MEM in a synchronous manner with a falling edge of clock signals CLK.

While the clock signals CLK and the delay clock signals DCLKX are at a high level, the nMOS transistors N1, N2 indicated in FIG. 3 are turned on, and the node ND1 changes to low level (FIG. 11 (a)). The latch circuit LT sets the dummy access signals DAC to high level in response to a low level node ND1 (FIG. 11 (b)). That is to say, the dummy access signals DAC are activated to high level in a synchronous manner with a rising edge of clock signals CLK. Next, the level shifter LS corresponding to the replica unit REP1 activates the dummy word line DWL1 to a high level voltage CVDD in response to the dummy access signals DAC being activated (FIG. 11 (c)).

As the dummy word line DWL1 changes to the high level voltage CVDD, the precharging operation of the dummy bit line DBL1 stops. Furthermore, as the dummy word line DWL1 is activated, the dummy memory cells DMC of the replica unit REP1 illustrated in FIG. 4 output a logic 0 to the dummy bit line DBL1. The data read from the dummy memory cells DMC is transmitted to the dummy bit line DBL1, and the precharge voltage VDD gradually decreases (FIG. 11 (d)).

The CMOS inverter receiving the voltage of the dummy bit line DBL1 outputs a high level when the voltage of the dummy hit line DBL1 decreases to a logic 0 level. Accordingly, the dummy word line DWL2 is activated to a high level (FIG. 11 (e)). As the dummy word line DWL2 changes to a high level, the precharge operation of the dummy bit line DBL2 stops.

As described above, the dummy bit lines DBL1 through DBL4 separately stop their precharge operations in response to the corresponding dummy word lines DWL1 through DWL4 being activated. Accordingly, the period during which the dummy hit lines DBL1 through DBL4 are in a floating state is minimized, and the impact from other signal lines such as coupling noise is prevented. As a result, the reading margin of the semiconductor memory MEM is increased.

By activating the dummy word line DWL2, the voltage of the dummy bit line DBL2 gradually decreases from the precharge voltage VDD (FIG. 11 (f)). Thereafter, the dummy word lines DWL3 and DWL4 sequentially change to high level, and the dummy bit lines DBL3 and DBL4 sequentially change to low level (FIG. 11 (g)).

Meanwhile, the predecoder PDEC starts a decode operation in response to the dummy access signals DAC changing to high level, and generates pre-row decode signals and precolumn decode signals. Accordingly, the row decoder RDEC and the column decoder CDEC start operating, and the word lines WL and column selection signal lines COL corresponding to address signals AD are activated to high level (FIG. 11 (h)). By activating the word lines WL, data is read from the memory cells MC to the bit lines BL, BLX. In his example, the memory cells MC from which data is read hold a logic 0, and therefore the voltage of the bit line BL gradually decreases from the precharge voltage (FIG. 11 (i)). The column switch. CSW receiving column selection signal lines COL of a high level is turned on, and the voltage of the hit lines BL, BLX is supplied to the sense amplifier SA via the global bit lines GBL, GBLX.

When the last dummy bit line DBL4 changes to low level, the operation control circuit CNT changes the reset signals RST to low level (FIG. 11 (j)). Accordingly, the pMOS transistor P1 illustrated in FIG. 3 is turned on, and the node ND1 changes to high level (FIG. 11 (k)). The dummy access signals DAC change to low level in response to the high level node ND1 (FIG. 11 (l)). Then, the dummy word lines DWL1 through DWL4 are inactivated to low level.

According to the low level, dummy word lines DWL1 through DWL4, the precharge transistor PT is turned on, and therefore the dummy bit lines DBL1 through DBL4 change to high level (FIG. 11 (m)). The predecoder PDEC stops the decode operation in response to the dummy access signals DAC changing to low level. Accordingly, the word lines WL and column selection signal lines COL are inactivated to low level (FIG. 11 (n)).

Meanwhile, the pulse generator PG and the buffer circuit BUF2 illustrated in FIG. 3 activate the sense amplifier enable signals SAE to high level in a synchronous manner with a falling edge of the dummy access signals DAC (FIG. 11 (o)). Accordingly, the sense amplifier SA starts an amplification operation. For example, the voltage difference VBL between the bit lines BL, BLX (more precisely, global bit lines GBL, GBLX) is set to be 110 mV at a timing when the sense amplifier enable signals SAE are activated. As described above, this example is implemented as the sense amplifier enable signals SAE are generated with the use of four replica units REP1 through REP4 each including 20 dummy memory cells.

The read data amplified by the sense amplifier is latched to a data output circuit as data output signals DOUT. Then, the data read from the memory cells MC is output from the data terminal I/O (FIG. 11 (p)). For example, the semiconductor memory MEM outputs the read data DOUT from the data terminal I/O while the clock signals CLK are at low level.

In the present embodiment, the voltage for activating the dummy word lines DWL (DWL1 through DWL4) is set at the same voltage for activating the word line signals WL, so that the operation timings of the dummy memory cells DMC are equal to the operation timings of the memory cells MC. As a result, the operation of setting the timings of the dummy word line signals DWL, i.e., the operation of designing the replica circuit REPC, is facilitated.

Furthermore, when the power source voltage IOVDD changes from the power source voltage VDD, the high level voltage CVDD generated from the power source voltage IOVDD also changes from the power source voltage VDD. Accordingly, the voltage for activating the word line signals WL changes, and the output timing of the data read into the hit lines BL, BLX from the memory cells MC changes. However, in the present embodiment, the voltage for activating the dummy word line signals DWL is the high level voltage CVDD that is the same as the voltage for activating the word line signals WL. Therefore, the voltage for activating the dummy word line signals DBL changes similarly to the voltage for activating the word line signals WL. As a result, even if the power source voltage IOVDD or the power source voltage VDD changes, the timings for activating the sense amplifier enable signals SAE are constantly optimized in accordance with the timings of the data that is read into the bit lines BL, BLX from the memory cells MC.

Figure 12:
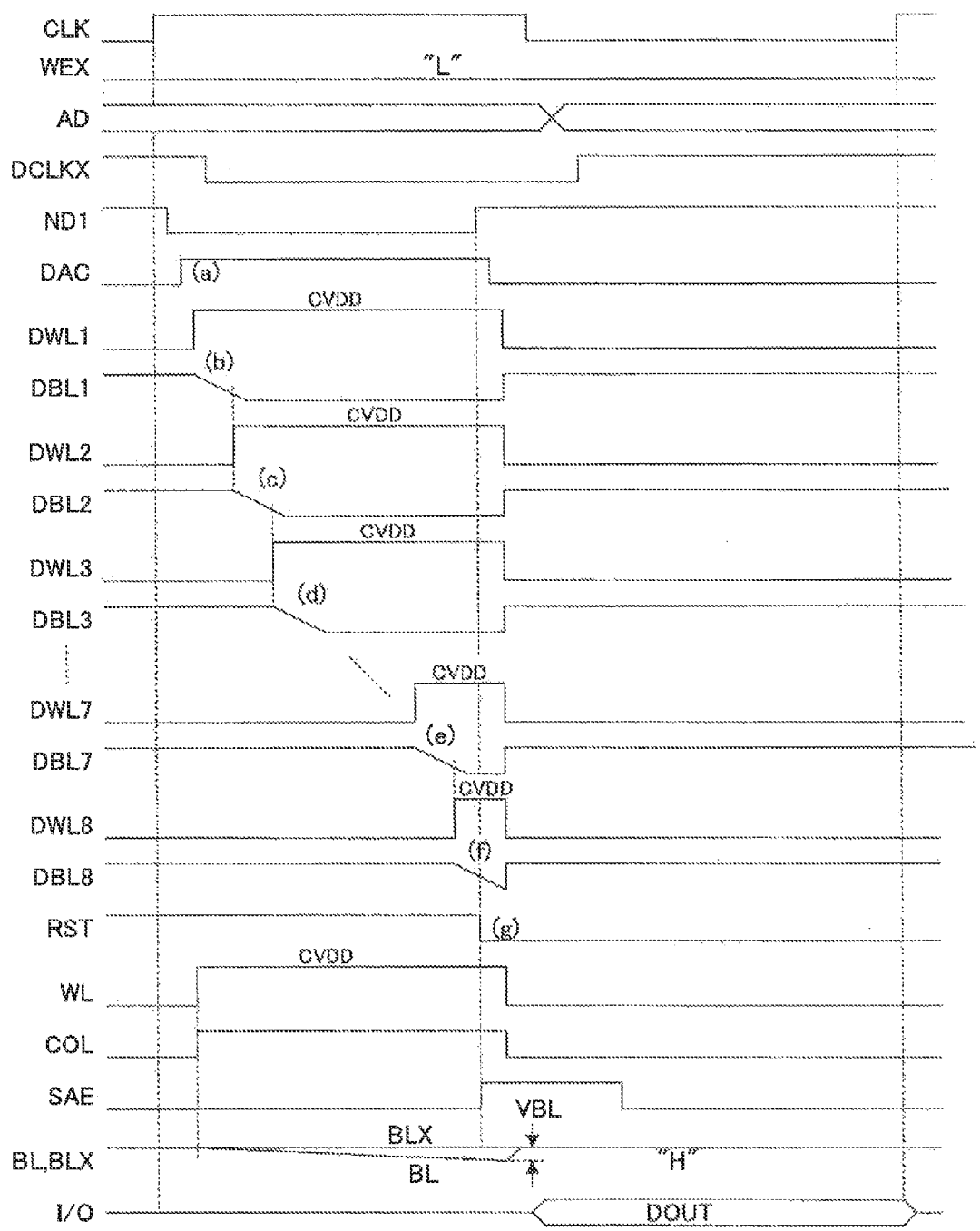
FIG. 12 illustrates another example of the read access operation of the semiconductor memory indicated in FIG. 2.

FIG. 12 illustrates another example of the read access operation of the semiconductor memory MEM indicated in FIG. 2. The same operations as those of FIG. 11 are not further described in detail. In the present example, the replica circuit REPC includes eight replica units REP1 through REP8 (n=8) each including 40 dummy memory cells DMC (m=40). Accordingly, the voltage difference VBL between the bit lines BL, BLX (more precisely, global bit lines GBL, GBLX) becomes 110 mV at a timing when the sense amplifier enable signals SAE are activated.

In the present example, the dummy word lines DWL1 through DWL8 sequentially change to high level in response to the dummy access signals DAC being activated, and the dummy bit lines DBL1 through DBL8 sequentially change to low level (FIG. 12 (*a, b, c, d, e, f*)). Furthermore, the reset signals RET change to low level in response to the last dummy bit line DBL8 changing to low level (FIG. 12 (*q*)). The other operations are the same as those of FIG. 11.

The same effects as the other embodiments are also achieved in the present embodiment. The precharge transistors PT formed in correspondence with the replica units REP1 through REPn separately stop their precharge operations in response to the corresponding dummy word lines DWL1 through DWL4 being activated. Accordingly, the period during which the dummy bit lines DBL1 through DBL4 are in a floating state is minimized, and the impact from other signal lines such as coupling noise is prevented.

By setting the voltage for activating the dummy word lines DWL1 through DWL4 to the same value CVDD as the voltage for activating the word line WL, the operation timings of the dummy memory cells DMC are made equal to the operation timings of the memory cells MC. Thus, the operation of setting the timings of the dummy word line signals DWL, i.e., the operation of designing the replica circuit REPC, is facilitated. Furthermore, even when the power source voltage IOVDD or the power source voltage VDD changes, the timings for activating the sense amplifier enable signals SAE are constantly optimized in accordance with the timings of the data that is read into the bit lines BL, BLX from the memory cells MC. Accordingly, the reading margin of the semiconductor memory MEM is improved, and the yield of the semiconductor memory MEM is increased.

Figure 13:
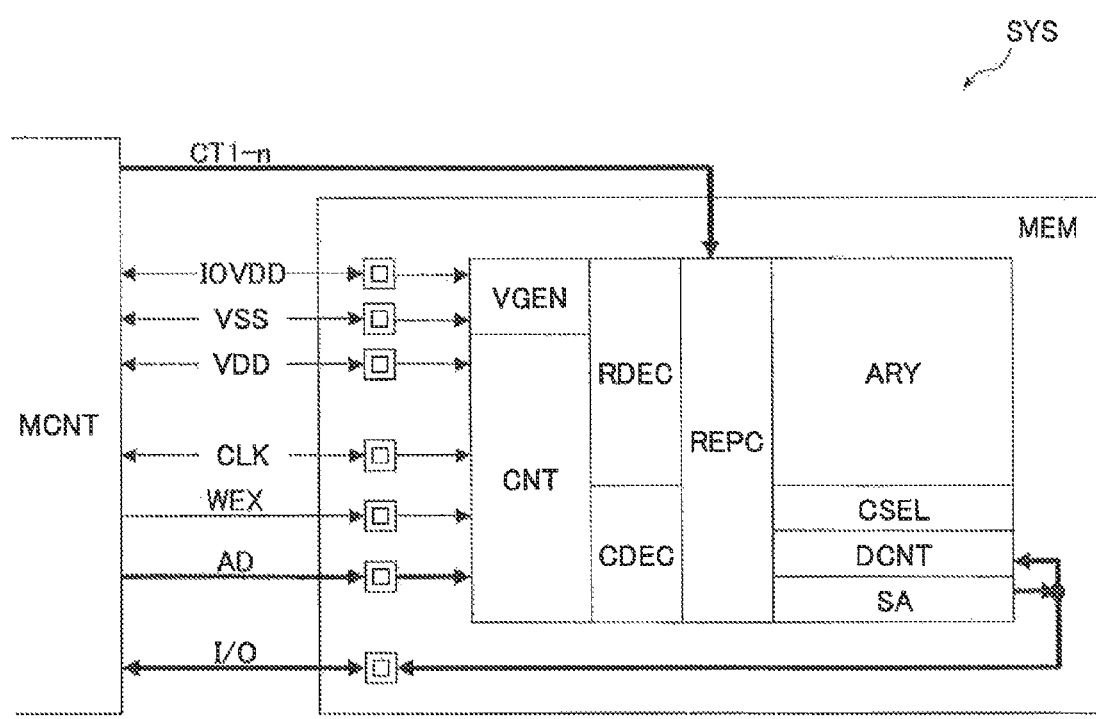
FIG. 13 illustrates an example of a semiconductor memory according to another embodiment.

FIG. 13 illustrates an example of a semiconductor memory MEM according to another embodiment. In this example, the replica circuit REPC receives a number of timing change signals CT (CT1 through CTn) via an external terminal. For example, the timing change signals CT are output from a memory controller MCNT for controlling access to the semiconductor memory MEM. Other configurations are the same as those illustrated in FIG. 2.

Figure 14:
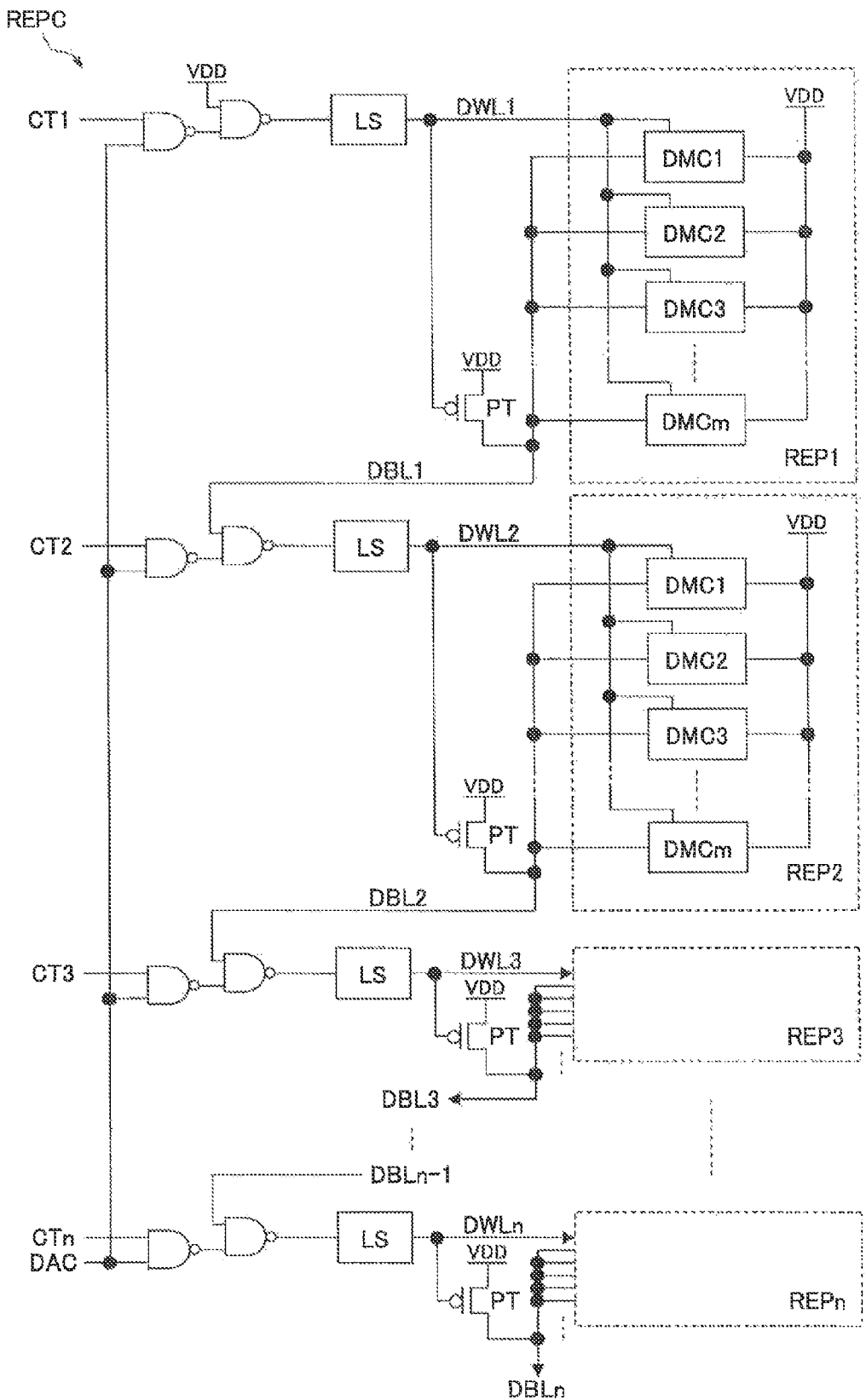
FIG. 14 illustrates an example of a replica circuit indicated in FIG. 13.

FIG. 14 illustrates an example of the replica circuit REPC indicated in FIG. 13. The replica circuit REPC includes a pair of NAND gates arranged in series, in correspondence with the replica units REP1 through REPn. The pair of NAND gates operate as a replica control unit for selecting one replica unit REP (REP1 through REPn) for supplying the dummy access signals DAC according to the level of the timing change signals CT, and prohibiting operations of replica units REP at stages prior to the selected replica unit REP. The NAND gate at the back stage is provided instead of the CMOS inverter for receiving dummy bit line signals DBL1 through DBLn illustrated in FIG. 4. The other configurations are the same as those illustrated in FIG. 4, except that the input signals of the level shifter LS are different.

The NAND gate at the front stage receives dummy access signals DAC and timing change signals CT (any one of CT1 through CTn). The NAND gate at the front stage is set to a valid state by receiving high level timing change signals CT, and operates as a selection circuit for inverting the level of the received dummy access signals DAC and outputting the inverted signals.

The output of the NAND gate at the back stage is connected to the corresponding level shifter LS. The NAND gate at the back stage corresponding to the replica unit REP1 receives a power source voltage VDD at one input and receives output signals from the NAND gate at the front stage at the other input. The NAND gate at the back stage corresponding to the replica units REP2 through. REPn receives, at one input, the dummy bit line signals DBL (for example, DBL1) from the replica unit REP (for example, REP1) at a prior stage, and receives output signals of the NAND gate at the front stage at the other input.

The NAND gate at the back stage operates as a dummy access control circuit for reading and accessing the corresponding dummy memory cells, in response to inverted signals of dummy access signals DAC from the NAND gate at the front stage or in response to the dummy bit line DBL corresponding to the replica unit REP of a prior stage changing to low level.

In the present embodiment, only one of the timing change signals CT1 through CTn is set to a high level. Only the level shifter LS corresponding to the NAND gate receiving the high level timing change signals CT changes the dummy word line DWL (any one of DWL1 through DWLn) to high level, in response to the high level of the dummy access signals DAC.

A level shifter LS, which is at a later stage of the level shifter LS corresponding to the pair of NAND gates receiving high level timing change signals CT, changes a dummy word line DWL (for example, DWL3) to high level, in response to the low level of the dummy word line DWL (for example, DWL2) of a prior stage. The level shifter LS, which is at a prior stage of the level shifter LS corresponding to the pair of NAND gates receiving high level timing change signals CT, maintains the dummy word line DWL (for example, DWL1) at low level, and maintains the dummy bit line DBL (for example, DBL1) at high level. Accordingly, the number of replica units REP operating to generate sense amplifier enable signals SAE may be easily changed. That is to say, the timing of generating the sense amplifier enable signals SAE may be adjusted.

FIG. 15 illustrates an example of operation specifications of the replica circuit REPC indicated in FIG. 14. In this example, the replica circuit REPC includes four replica units REP1 through REP4, and each of the replica units REF1 through REP4 includes 20 dummy memory cells DMC. In this example, four lines of timing change signals CT (CT1 through CT4) are supplied to the semiconductor memory MEM. One of the timing change signals CT is set to a logic 1, and the rest of the timing change signals CT are set to a logic 0.

The number of stages of replica units REP used for generating sense amplifier enable signals SAE changes in accordance with the line of timing change signals CT set to the logic 1. When the number of stages of used replica units REP is small, the timing of activating the sense amplifier enable signals SAE is accelerated. When the number of stages of used replica units REP is large, the timing of activating the sense amplifier enable signals SAE is delayed.

Figure 16:
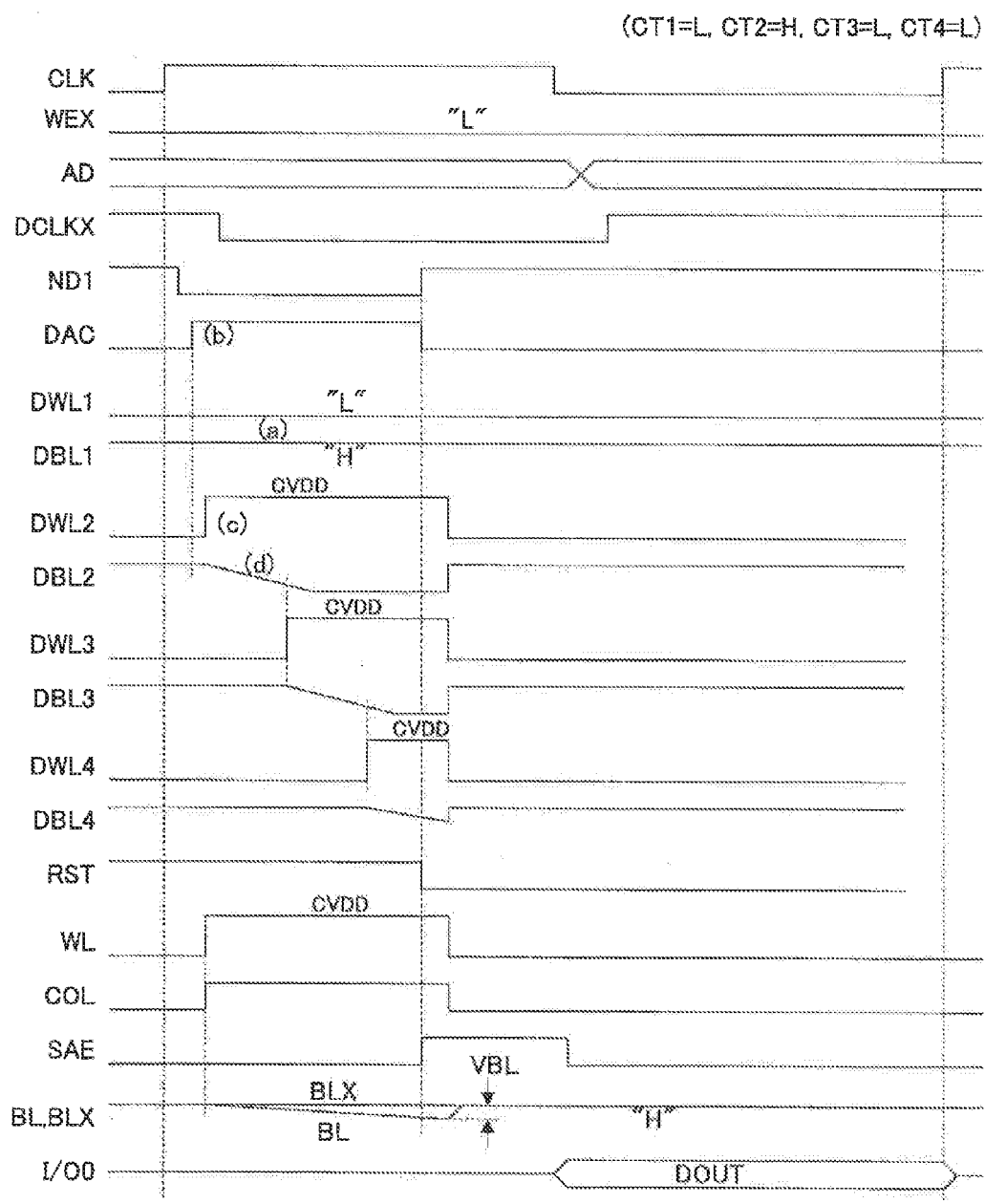
FIG. 16 illustrates an example of a read access operation of the semiconductor memory indicated in FIG. 13.

FIG. 16 illustrates an example of a read access operation of the semiconductor memory MEM indicated in FIG. 13. The same operations as those of FIG. 11 are not further described in detail. In the present example, the replica circuit REPC includes four replica units REP1 through REP4, each including 20 dummy memory cells DMC. Only the timing change signals CT2 are set at a high level H, and the other timing change signals CT1, CT3, CT4 are set at a low level L.

At this time, the operation of the replica unit REP1 indicated in FIG. 13 is prohibited. The dummy word line DWL1 is maintained at a low level L, and the dummy bit line DBL1 is maintained at a high level H (FIG. 16 (*a*)). Then, the replica unit REP2 corresponding to the high level timing change signals CT2 and the replica units REP3 and REP4 at stages after the replica unit REP2 are used to generate the sense amplifier enable signals SAE. Specifically, the dummy word line DWL2 changes to high level in response to the dummy access signals DAC being activated, and the dummy bit line DBL2 gradually changes to low level (FIG. 16 (*h, c, d*)). Subsequent operations are the same as those of FIG. 11. In FIG. 16, by reducing the number of replica units REP being used, the timing of activating the sense amplifier enable signals SAE is faster than that of FIG. 11.

Figure 17:
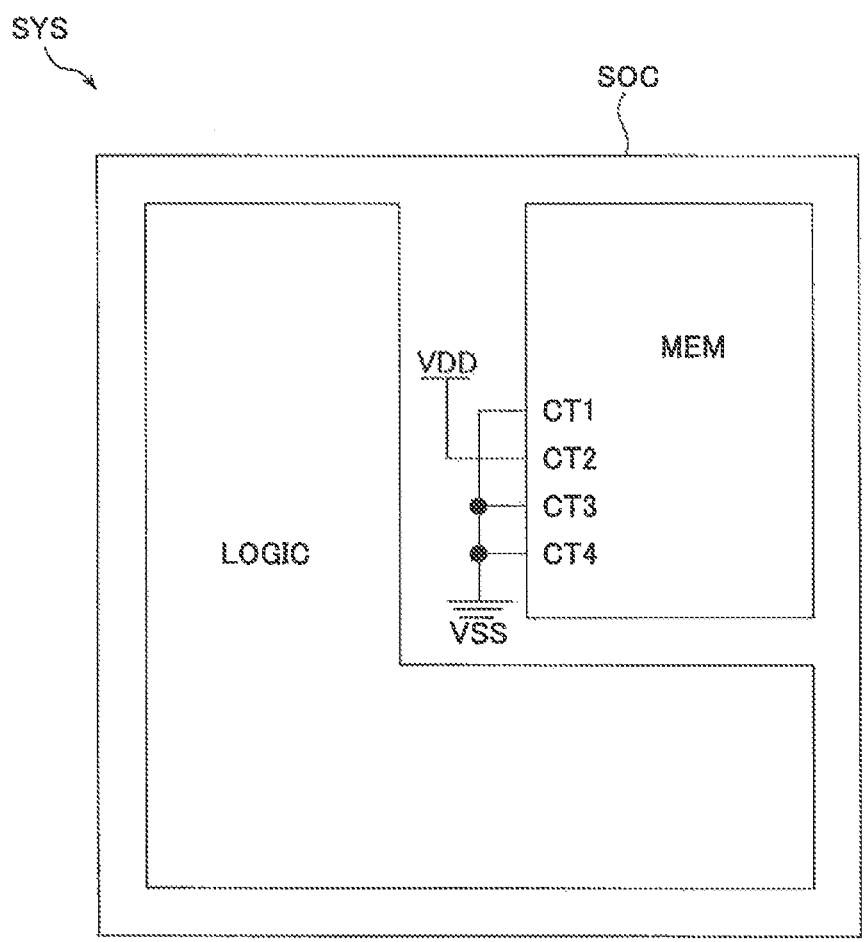
FIG. 17 illustrates an example of a system in which the semiconductor memory indicated in FIG. 13 is installed.

FIG. 17 illustrates an example of the system SYS in which the semiconductor memory MEM indicated, in FIG. 13 is installed. For example, the system SYS includes a system on chip SOC in which a logic chip LOGIC and a memory chip MEM are formed. Although not particularly limited, the logic chip LOGIC has a function of a memory controller for accessing the semiconductor memory MEM.

In the present example, in the timing change terminals CT1 through CT4 of the semiconductor memory MEM, metal wiring layers are used on the system on chip SOC (silicon) to connect to the power source line VDD or the ground line VSS. That is to say, the levels of the timing change terminals CT1 through CT4 are determined depending on the wiring patterns of the photomask for manufacturing the system on chip SOC. Accordingly, the levels of the timing change terminals CT1 through CT4 are set when manufacturing the system on chip SOC.

Figure 18:
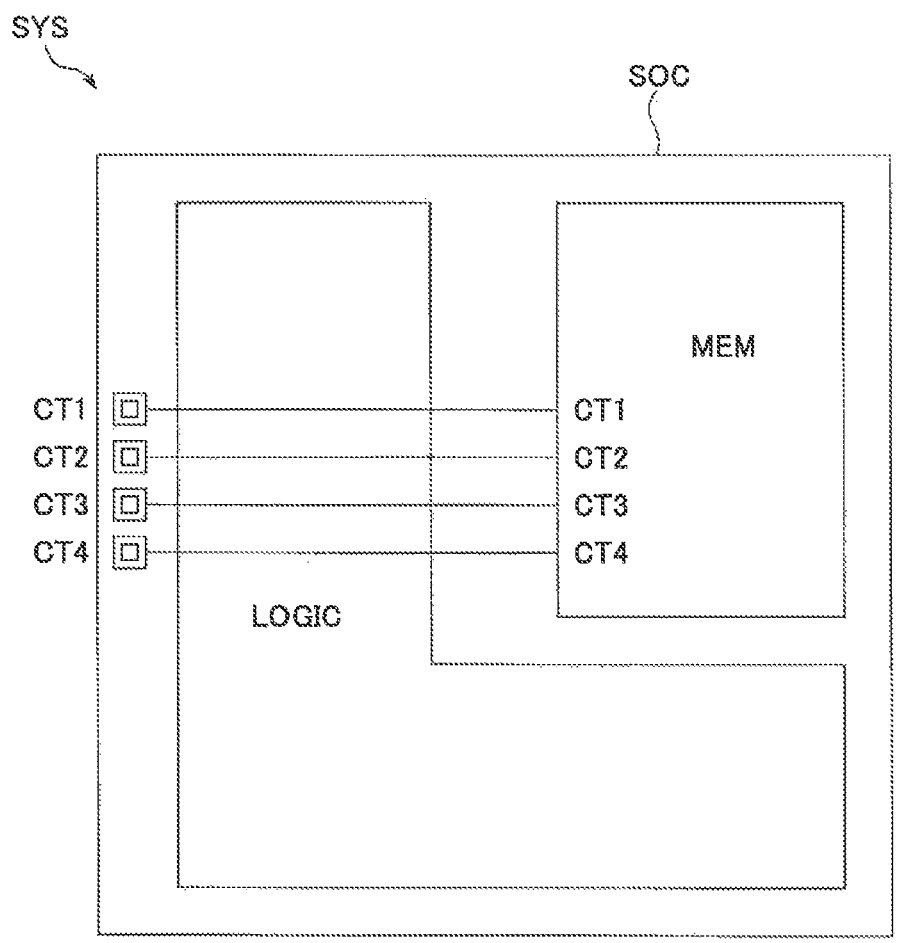
FIG. 18 illustrates an example of another system in which the semiconductor memory indicated in FIG. 13 is installed.

FIG. 18 illustrates an example of another system SYS in which the semiconductor memory MEN indicated in FIG. 13 is installed. In the present example, the timing change terminals CT1 through CT4 of the semiconductor memory MEN are connected to the external terminal of the system on chip SOC. The levels of the timing change terminals CT1 through CT4 are set on the substrate on which the system on chip SOC is installed. Alternatively, the levels of the timing change terminals CT1 through CT4 are set by a higher level controller for controlling the system on chip SOC. Thus, the levels of the timing change terminals CT1 through CT4 may be set when the power of the system SYS is turned on or while the system SYS is operating.

Figure 19:
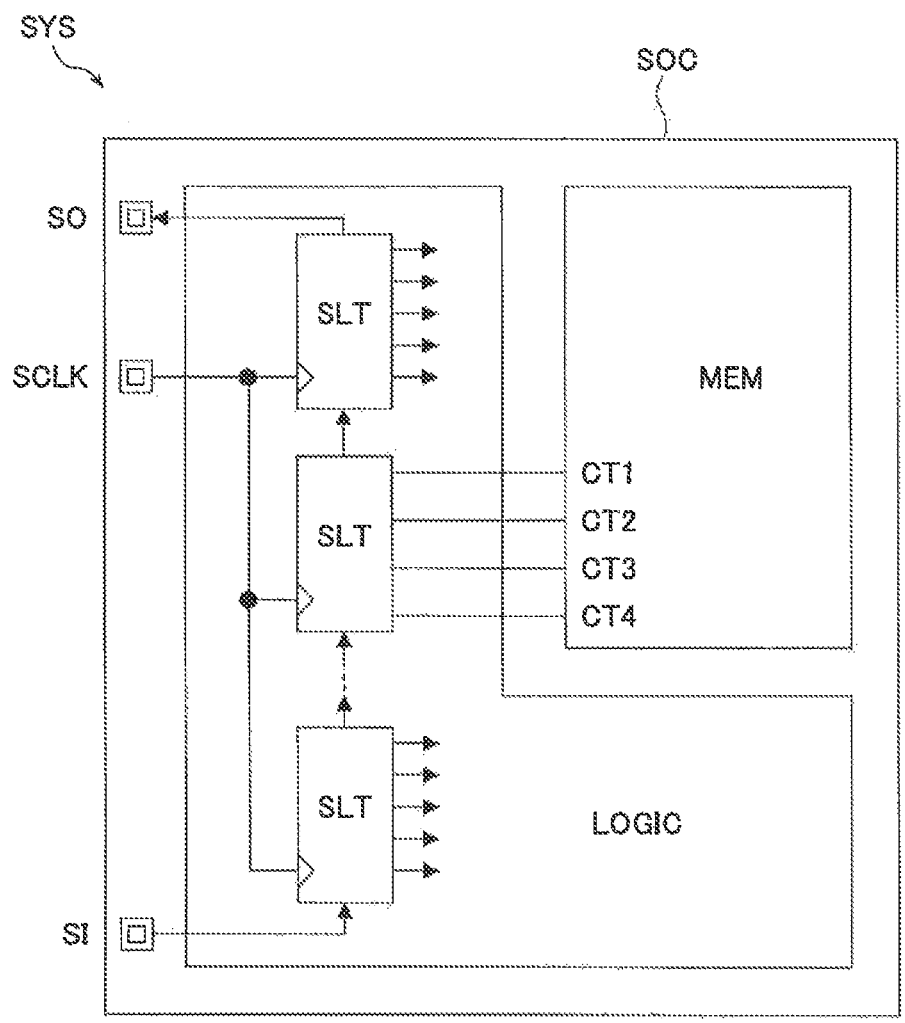
FIG. 19 illustrates another example of the system in which the semiconductor memory indicated in FIG. 13 is installed.

FIG. 19 illustrates another example of the system SYS in which the semiconductor memory MEM indicated in FIG. 13 is installed. In the present example, the levels of the timing change terminals CT1 through CT4 are set with the use of a scan latch SLT formed in the logic chip LOGIC. Specifically, signals for setting the levels of the timing change terminals CT1 through CT4 are supplied from the scan input terminal SI in a synchronous manner with scan clock signals SCLK. Accordingly, the levels of the timing change terminals CT1 through CT4 may be set when the power of the system SYS is turned on. The scan latch SLT is also used for implementing an interconnect test (substrate connect test) of the logic chip LOGIC with the use of a scan input terminal SI and a scan output terminal SO.

Figure 20:
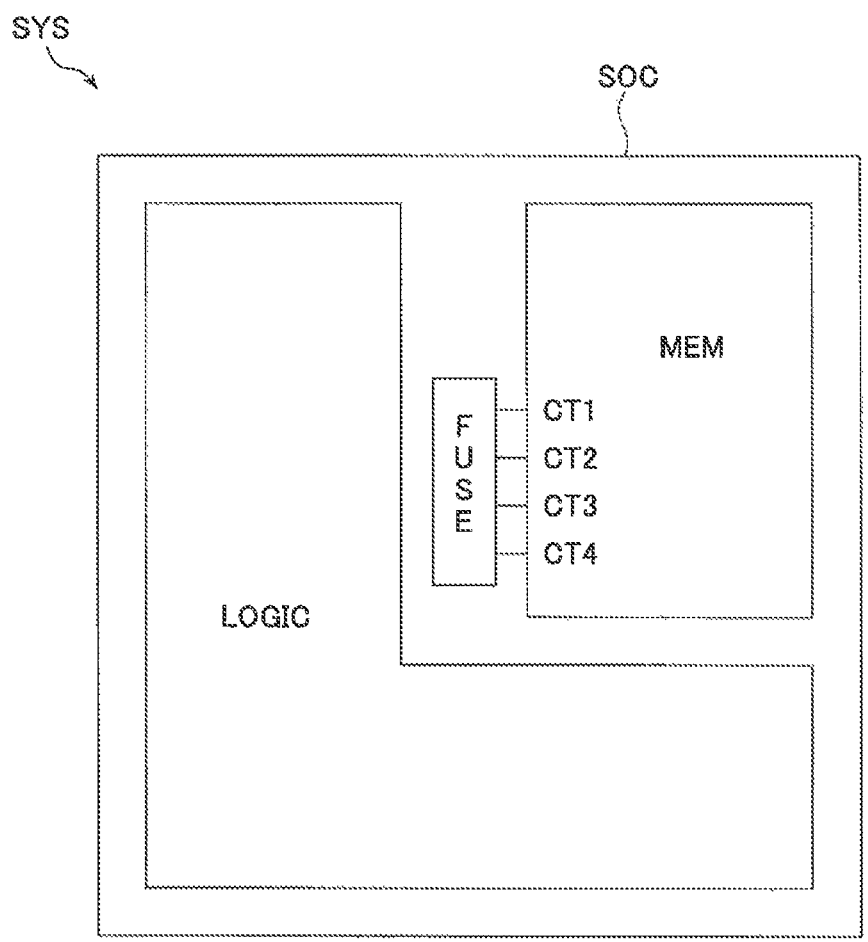
FIG. 20 illustrates another example of the system in which the semiconductor memory indicated in FIG. 13 is installed.

FIG. 20 illustrates another example of the system SYS in which the semiconductor memory MEM indicated in FIG. 13 is installed. In the present example, the timing change terminals CT1 through CT4 are connected to a fuse circuit FUSE formed in, the system on chip SOC. By programming the fuse circuit FUSE, the levels of the timing change terminals CT1 through CT4 are set. Thus, the levels of the timing change terminals CT1 through CT4 are set in a test procedure of the system on chip SOC or in a manufacturing procedure of the system SYS.

The same effects as the other embodiments are also achieved in the present embodiment. Furthermore, the dummy word lines DWL1 through DWLn to be activated first in response to dummy access signals DAC may be arbitrarily selected, according to the levels of the timing change signals CT1 through CTn. Accordingly, it is possible to adjust the time from when the dummy access signals DAC are activated to when the sense amplifier enable signals SAE are activated. For example, even if the threshold voltage of the transistor shifts due to variations in manufacturing conditions, the timings of activating the sense amplifier enable signals SAE are optimized according to the timing change signals CT1 through CTn. As a result, the reading margin of the semiconductor memory MEM is improved, and the yield of the semiconductor memory MEM is increased.

Figure 21:
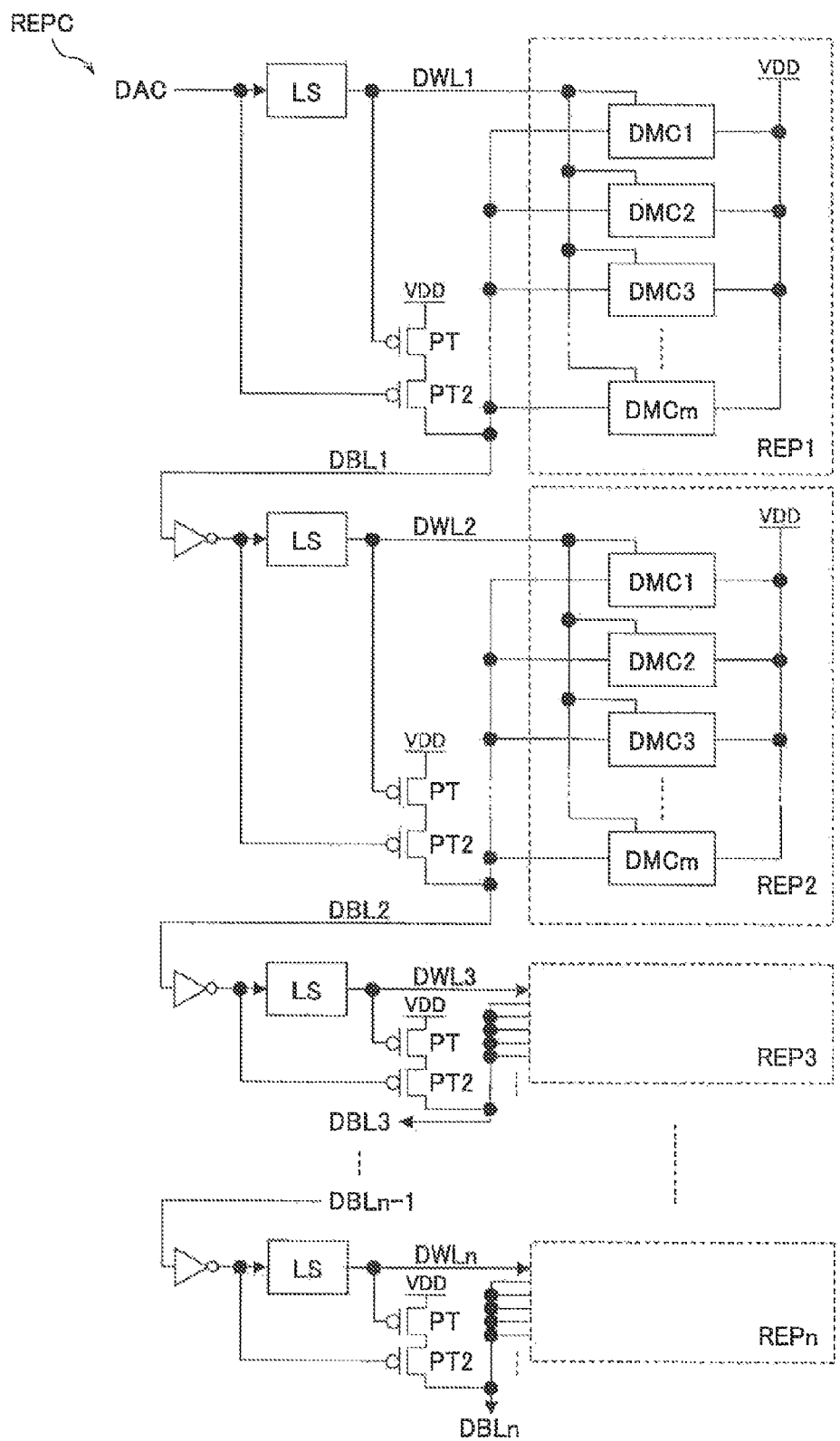
FIG. 21 illustrates an example of a replica circuit according to another embodiment.

FIG. 21 illustrates an example of the replica circuit REPC according to another embodiment. In the present embodiment, the replica circuit REPC includes a precharge transistor PT2 disposed between a precharge transistor PT and a dummy bit line DBL any one of DBL1 through DBLn), corresponding to each of the replica units REP1 through REPn. The precharge transistor PT2 is a pMOS transistor. The gate of the precharge transistor PT2 corresponding to the replica unit REP1 of the first stage receives the dummy access signals DAC. The gate of the precharge transistor PT2 corresponding to the replica unit REP2 (any one of REP2 through REPn) from the second stage onward receives the inverse logic of the dummy bit line signals DBL (any one of DBL1 through DBLn-1) from the prior stage. Other configurations of the replica circuit REPC are the same as those of FIG. 4.

The high level voltage of the dummy word lines DWL1 through DWLn is set at a high level voltage CVDD that is higher than the power source voltage VDD, by the level shifter LS. As illustrated in FIG. 2, the high level voltage CVDD is generated as an internal voltage generating circuit VGEN reduces the power source voltage IOVDD for I/O. Accordingly, as the power source voltage IOVDD decreases, the high level voltage CVDD also decreases. As the high level voltage CVDD becomes lower than the power source voltage VDD, when the dummy word line DWL (any one of DWL1 through DWLn) is activated to a high level voltage CVDD, the gate voltage of the precharge transistor PT becomes relatively low. Accordingly, the resistance between the source and the drain of the precharge transistor PT becomes low, and a leak current flows.

In the present embodiment, it is possible to prevent a leak current from flowing to the dummy bit line (any one of DBL1 through DBLn-1), according to the precharge transistor PT2 that is turned off when a high level VDD is received at the gate. Accordingly, for example, when the dummy word line DWL1 is activated to a high level voltage CVDD, and a low level is output from the dummy memory cell DMC to the dummy bit line DBL1, it is possible to prevent the dummy bit line DBL1 from being charged via the precharge transistor PT. That is to say, the timing of activating the sense amplifier enable signals SAE is prevented from being delayed due to the leak current of the precharge transistor PT.

The same effects as the other embodiments are also achieved in the present embodiment. Furthermore, when the activation level of the dummy word line DWL is set at the high level voltage CVDD, and the precharge level of the dummy bit line DBL is set at the power source voltage VDD, the timing of activating the sense amplifier enable signals SAE is prevented from shifting due to variations in the high level voltage CVDD. As a result, the reading margin of the semiconductor memory MEM is increased.

Figure 22:
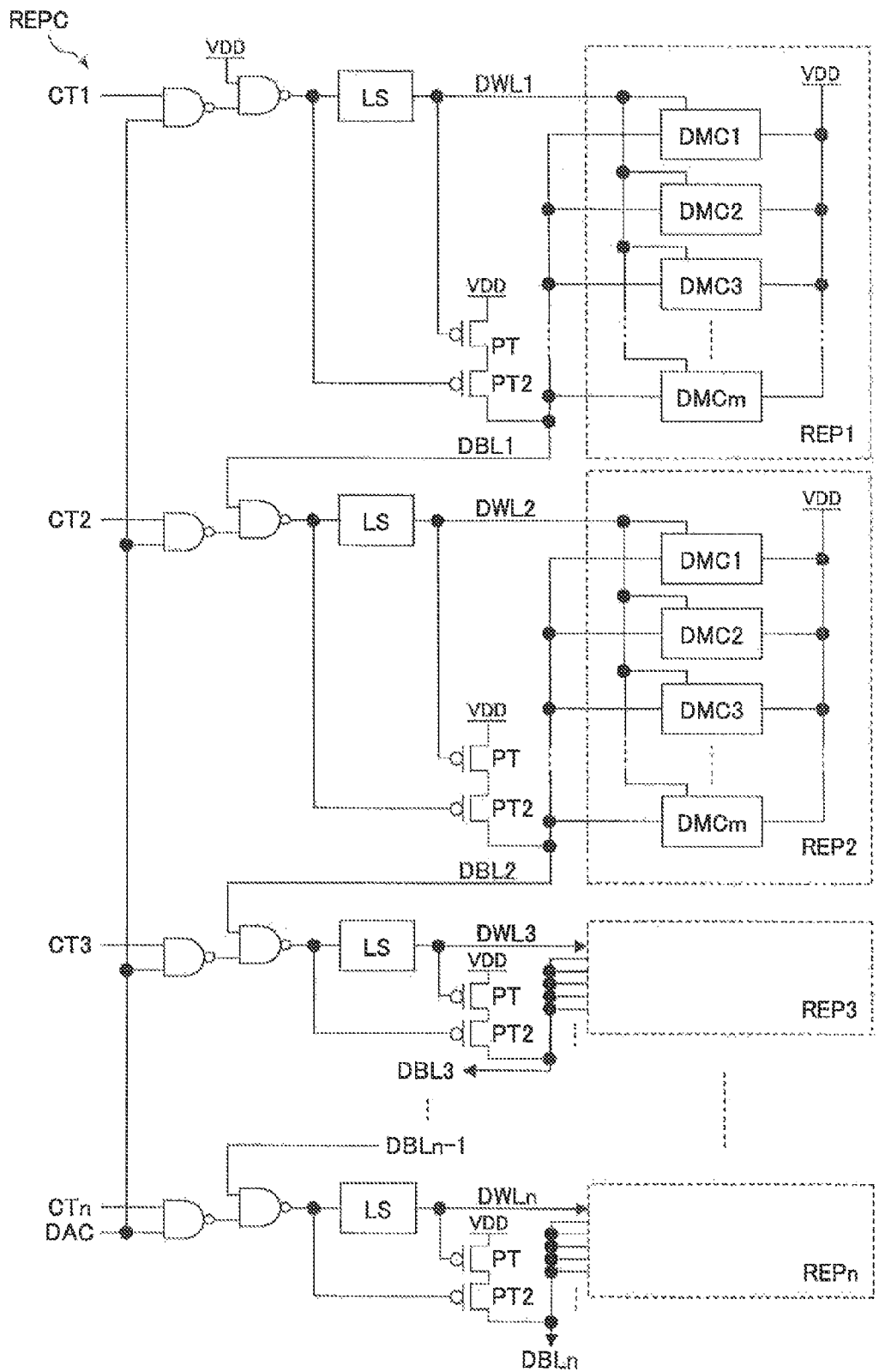
FIG. 22 illustrates an example of a replica circuit according to another embodiment.

FIG. 22 illustrates an example of a replica circuit REPC according to another embodiment. In the present embodiment, in the replica circuit REPC, the pair of NAND gates arranged in series as indicated in FIG. 14 are added to the circuit of FIG. 21. That is to say, in the circuit of FIG. 22, the function of changing the number of replica units REP operating for generating the sense amplifier enable signals SAE by the timing change signals CT1 through CTn, is added to the replica circuit REPC. The same effects as the other embodiments are also achieved in the present embodiment.

Figure 23:
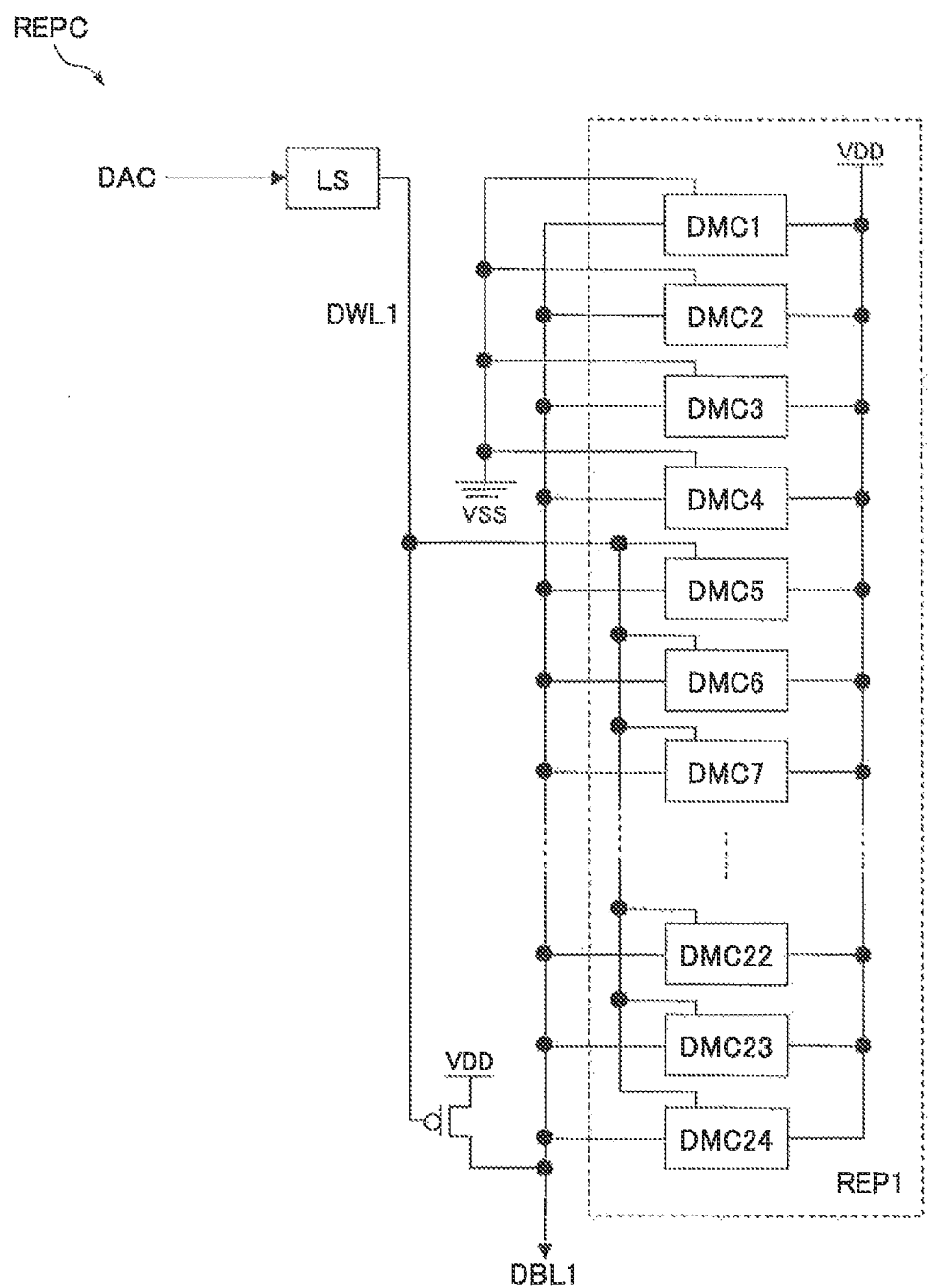
FIG. 23 illustrates another example of the replica unit.

FIG. 23 illustrates another example of the replica unit REP1. For example, the replica unit REP1 of the replica circuit REPC includes 24 dummy memory cells DMC1 through DMC24. The other replica units REP2 through REPn are the same as the replica unit REP1. The other configurations of the replica circuit REPC are the same as those of FIG. 4. The circuit of FIG. 23 is applicable to FIGS. 1, 4, 14, 21, and 22.

In the present example, the dummy memory cells DMC1 through DMC4 are connected to the ground line VSS instead of the dummy word line DWL1, to prohibit operation. For example, the connection to the ground line VSS is performed by a wiring pattern of a photomask.

In the replica unit REP of FIG. 23, the number of dummy memory cells DMC connected to the dummy word line DWL1 is changed by a wiring pattern, and therefore it is possible to adjust the speed of voltage decrease of the dummy bit line DBL1 when the dummy word line DWL1 is activated to high level. Accordingly, it is possible to fine adjust the timing of activating the sense amplifier enable signals SAE.

By increasing the number of dummy memory cells, inconsistencies in transistor characteristics are averaged out, and the timing of activating the sense amplifier is optimized. As a result, the reading margin of the semiconductor memory is improved, and the yield of the semiconductor memory, an indicator of good quality, is increased.

According to the above detailed descriptions, the characteristics and the advantages of the embodiments are made clear. The scope of the claims may extend to the characteristics and the advantages of the embodiments, without departing from the spirit and the scope of the present invention. Furthermore, those skilled in the art may easily devise modifications and variations, and the scope of the embodiments having inventiveness is not limited to the above, and appropriate modifications and equivalents may be made within the scope of the disclosed embodiments.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A semiconductor memory comprising:
a real memory cell;
a sense amplifier configured to amplify data read from the real memory cell in response to activation of a sense amplifier enable signal;
a replica circuit including a plurality of replica units connected in series, each of the plurality of replica units including a dummy word line, a dummy bit line, and a plurality of dummy memory cells connected in parallel between the dummy word line and the dummy bit line, each of the plurality of replica units configured to read data from the plurality of dummy memory cells by activating the dummy word line and to output the data to the dummy bit line, wherein the dummy word line of a first one of the plurality of replica units is activated in response to data which is output to the dummy bit line of a second one of the plurality of replica units of a prior stage prior to the first one of the plurality of replica units; and
an operation control circuit configured to activate a dummy access signal to activate the dummy word line of one of the plurality of replica units of a first stage in response to a read command, and to activate the sense amplifier enable signal in response to data output to the dummy bit line of one of the plurality of replica units of a last stage.

2. The semiconductor memory according to claim 1, wherein
the replica circuit includes a replica control unit configured to select one of the plurality of replica units in which the dummy access signal is to be supplied in accordance with a level of a timing change signal, and to prohibit operations of one of the plurality of replica units of a prior stage of the selected one of the plurality of replica units, wherein
the selected one of the replica units operates as one of the plurality of replica units of the first stage.

3. The semiconductor memory according to claim 2, wherein
the replica control unit includes
a plurality of selection circuits respectively provided for the plurality of replica units and to receive the dummy access signal, wherein one of the plurality of selection circuits outputs the received dummy access signal in accordance with the level of the time change signal, and
a plurality of dummy access control circuits respectively provided for the plurality of replica units, wherein one of the plurality of dummy access control circuits provided for the first one of the plurality of replica units accesses one of the plurality of dummy memory cells of the first one of the plurality of replica units, in response to the dummy access signal from one of the plurality of selection circuits, or data read from the second one of the plurality of replica units of the prior stage.

4. The semiconductor memory according to claim 1, further comprising:
a plurality of precharge circuits respectively connected to the plurality of dummy bit lines of the plurality of replica units, wherein one of the plurality of precharge circuits precharges one of the plurality of dummy bit lines when a dummy word line of a corresponding one of the plurality of replica units is inactivated.

5. The semiconductor memory according to claim 4, wherein
each of the plurality of precharge circuits includes a first transistor and a second transistor connected in series between a first power source line having a first high level voltage and the dummy bit line,
a gate of the first transistor included in each of the plurality of precharge circuits is connected to an output of a corresponding one of a plurality of level shifters for the precharge circuit, and a gate of the second transistor included in each of the plurality of precharge circuits is connected to an input of the corresponding one of the plurality of level shifters for the precharge circuit.

6. The semiconductor memory according to claim 4, further comprising:
a plurality of level shifters respectively provided for the plurality of replica units, and configured to convert an activation level of a dummy word line from a first high level voltage to a second high level voltage.

7. A system comprising:
the semiconductor memory according to claim 1; and
a controller configured to control access of the semiconductor memory.

* * * * *